(12) United States Patent
Seo et al.

(10) Patent No.: US 9,184,345 B2
(45) Date of Patent: Nov. 10, 2015

(54) LIGHT EMITTING DIODE AND LIGHT EMITTING DIODE LAMP

(75) Inventors: Noriyoshi Seo, Hiki-gun (JP); Atsushi Matsumura, Chichibu (JP); Ryouichi Takeuchi, Kawasaki (JP)

(73) Assignee: SHOWA DENKO K.K, Tokyo (JP)

( * ) Notice: Subject to any disclaimer, the term of this patent is extended or adjusted under 35 U.S.C. 154(b) by 0 days.

(21) Appl. No.: 13/809,294

(22) PCT Filed: Jul. 8, 2011

(86) PCT No.: PCT/JP2011/065694
§ 371 (c)(1),
(2), (4) Date: Jan. 9, 2013

(87) PCT Pub. No.: WO2012/008379
PCT Pub. Date: Jan. 19, 2012

(65) Prior Publication Data
US 2013/0112999 A1    May 9, 2013

(30) Foreign Application Priority Data

Jul. 13, 2010 (JP) ................................. 2010-158655
Aug. 18, 2010 (JP) ................................. 2010-183207

(51) Int. Cl.
*H01L 33/30* (2010.01)
*H01L 33/06* (2010.01)
*A01G 9/26* (2006.01)
(Continued)

(52) U.S. Cl.
CPC *H01L 33/30* (2013.01); *A01G 9/26* (2013.01); *H01L 33/06* (2013.01); *H01L 33/12* (2013.01); *H01L 33/405* (2013.01); *H01L 2224/45144* (2013.01); *H01L 2224/48091* (2013.01); *H01L 2224/48465* (2013.01); *H01L 2224/49107* (2013.01); *H01L 2224/73265* (2013.01); *H01L 2924/12032* (2013.01)

(58) Field of Classification Search
None
See application file for complete search history.

(56) References Cited

U.S. PATENT DOCUMENTS 4,084,905 A * 4/1978 Schreiber et al. ............. 356/317
5,153,889 A * 10/1992 Sugawara et al. .......... 372/45.01
5,276,698 A * 1/1994 Yoshida et al. .......... 372/45.011

(Continued)

FOREIGN PATENT DOCUMENTS

CN    102422445 A    4/2012
JP    05-175610 A    7/1993

(Continued)

OTHER PUBLICATIONS

Ritter et al., "Energy Level Alignments in Starined-Layer GaInP/AlGaInP Laser Diodes: Model Solid Theory Analysis of Pressure-Photoluminescence Experiments", phys. stat.sol. (b) vol. 211, pp. 869-883 (1999).*

(Continued)

*Primary Examiner* — Johannes P Mondt
(74) *Attorney, Agent, or Firm* — Sughrue Mion, PLLC

(57) ABSTRACT

A light emitting diode is provided by the present invention which includes a pn junction-type light emitting unit having a light emitting layer (10) composed of n layers of a strained light emitting layer (12) and n–1 layers of a barrier layer (13), wherein when a barrier layer exists, the light emitting layer (10) has a structure in which one strained light emitting layer (12) and one barrier layer (13) are laminated alternately, n represents an integer of 1 to 7, and the thickness of the light emitting layer (10) is not more than 250 nm.

25 Claims, 9 Drawing Sheets

(51) Int. Cl.
   *H01L 33/12* (2010.01)
   *H01L 33/40* (2010.01)

(56) References Cited

U.S. PATENT DOCUMENTS

| | | | |
|---|---|---|---|
| 5,543,354 A * | 8/1996 | Richard et al. | 117/89 |
| 5,981,976 A | 11/1999 | Murasato | |
| 6,160,829 A * | 12/2000 | Sawano | 372/45.01 |
| 6,417,522 B1 | 7/2002 | Wang et al. | |
| 6,469,314 B1 | 10/2002 | Grillot et al. | |
| 6,797,987 B2 | 9/2004 | Chen | |
| 6,987,286 B2 * | 1/2006 | McGill et al. | 257/97 |
| 7,244,630 B2 * | 7/2007 | Krames et al. | 438/47 |
| 2002/0038866 A1 | 4/2002 | Nakatsu et al. | |
| 2002/0098606 A1 | 7/2002 | Nakamura et al. | |
| 2003/0164503 A1 | 9/2003 | Chen | |
| 2003/0218172 A1 | 11/2003 | Sugawara et al. | |
| 2006/0220031 A1 | 10/2006 | Krames et al. | |
| 2007/0228394 A1 | 10/2007 | Asano | |
| 2008/0061307 A1 | 3/2008 | Ikeda et al. | |
| 2008/0093612 A1 | 4/2008 | Konno et al. | |
| 2008/0112452 A1 * | 5/2008 | Chakraborty et al. | 372/45.011 |
| 2009/0121242 A1 | 5/2009 | Watanabe et al. | |
| 2009/0206359 A1 * | 8/2009 | Nabekura | 257/103 |
| 2009/0302307 A1 | 12/2009 | Grönninger et al. | |
| 2010/0006818 A1 | 1/2010 | Matsumura | |
| 2010/0258826 A1 | 10/2010 | Takeuchi | |

FOREIGN PATENT DOCUMENTS

| | | |
|---|---|---|
| JP | 09-037648 A | 2/1997 |
| JP | 11-087764 A | 3/1999 |
| JP | 11-196671 A | 7/1999 |
| JP | 2000-151024 A | 5/2000 |
| JP | 3230638 B | 11/2001 |
| JP | 2002-027831 A | 1/2002 |
| JP | 2002-111053 A | 4/2002 |
| JP | 3373561 B | 2/2003 |
| JP | 2003-338637 A | 11/2003 |
| JP | 2004-000093 A | 1/2004 |
| JP | 2004-221042 A | 8/2004 |
| JP | 2007-013107 A | 1/2007 |
| JP | 2007-019124 A | 1/2007 |
| JP | 2007-194536 | 8/2007 |
| JP | 2008-016412 A | 1/2008 |
| JP | 2008-103627 A | 5/2008 |
| JP | 2009-032752 A | 2/2009 |
| KR | 10-2009-0009912 A | 1/2009 |
| TW | 577178 B | 2/2004 |
| TW | 200707806 A | 2/2007 |
| TW | 200802551 A | 1/2008 |
| TW | 200939542 A | 9/2009 |
| WO | 2008/099699 A1 | 8/2008 |
| WO | 2010/103752 A1 | 9/2010 |

OTHER PUBLICATIONS

Hamada et al., "Room-temperature CW Operation of 610 nm Band AlGaInP strained multiquantum well laser diodes with multiquantum barrier", Electronics Letters vol. 28, No. 19, pp. 1834-1836 (1992).*

Lee et al., "Characterization of GaAs buffer function in GaAs/InP strained structure grown by MBE", Thin Solid Films, vol. 286, pp. 107-110 (1996).*

Sale et al., "VCSELs for 640 nm to 1100 nm Emission", SPIE vol. 3004, Conference title: "Fabrication, Testing and Reliability of Semiconductor Lasers II", San José, CA (Feb. 8, 1997).*

Office Action with a mailing date of Dec. 24, 2013 for corresponding Taiwanese Patent Application No. 100124531.

International Search Report for PCT/JP2011/065694 dated Oct. 11, 2011.

Office Action dated Feb. 5, 2014, issued by the Korean Intellectual Property Office in Application No. 10-2013-7000690.

Notice of Reasons for Rejection dated Jun. 3, 2014, issued by the Japan Patent Office in Japanese Application No. 2010-183207.

Communication dated Jan. 13, 2015, issued by the Intellectual Property Office of the People's Republic of China in counterpart application No. 201180043286.6.

Supplementary Partial European Search Report dated May 6, 2015, issued by the European Patent Office in counterpart application No. 11806709.9.

* cited by examiner

LIGHT EMITTING DIODE AND LIGHT EMITTING DIODE LAMP

CROSS REFERENCE TO RELATED APPLICATIONS

This application is a National Stage of International Application No. PCT/JP2011/065694, filed on Jul. 8, 2011, which claims priority from Japanese Patent Application No. 2010-158655, filed Jul. 13, 2010 and JP 2010-183207, filed Aug. 18, 2010, the contents of all of which are incorporated herein by reference in their entirety.

TECHNICAL FIELD

The present invention relates to a light emitting diode and a light emitting diode lamp, and relates particularly to a light emitting diode having a rapid response time, and a light emitting diode lamp that uses the light emitting diode.

BACKGROUND ART

In recent years, plant growth using artificial light sources has been the subject of much research. In particular, cultivation methods using illumination from light emitting diodes (abbreviation: LED), which exhibit excellent monochromaticity, provide favorable energy conservation and long life, and can be easily miniaturized, are garnering much attention.

Based on the results of research to date, one emission wavelength band that has been confirmed as an effective light source for plant growth (photosynthesis) is red light having a wavelength within the region from 600 to 700 nm.

Light within the wavelength vicinity of 660 to 670 nm exhibits particularly favorable reaction efficacy for photosynthesis, and is thus a preferred light source. In order to generate this wavelength, light emitting layers composed of AlGaAs or InGaNP or the like are currently being investigated (for example, see Patent Documents 1 to 3).

On the other hand, compound semiconductor LEDs having a light emitting layer composed of an aluminum-gallium-indium phosphide (composition formula: $(Al_XGa_{1-X})_YIn_{1-Y}P$, wherein $0 \leq X \leq 1$ and $0 < Y \leq 1$) are also known.

Among these types of LED compound semiconductors, a light emitting layer having the composition $Ga_{0.5}In_{0.5}P$ exhibits the longest wavelength, and the peak wavelength obtained from this light emitting layer is in the vicinity of 650 nm.

Further, generally, a light emitting unit having a light emitting layer composed of $(Al_XGa_{1-X})_YIn_{1-Y}P$ (wherein $0 \leq X \leq 1$ and $0 < Y \leq 1$) is formed on a monocrystalline substrate of gallium arsenide (GaAs), which blocks the light from the light emitting layer and is not particularly strong mechanically.

Accordingly, much research is being conducted with the aims of obtaining higher brightness visible light LEDs, and achieving further improvements in the mechanical strength of these devices.

For example, Patent Document 4 discloses a so-called bonded LED prepared by removing the substrate material such as GaAs that blocks the light from the light emitting layer, and then bonding a support layer which is formed from a material that can transmit the light from the light emitting layer and exhibits excellent mechanical strength.

Patent Document 5 describes investigations that have been conducted, for laser devices having a different light emission mechanism, into light emitting layers having strain (hereafter also referred to as "strained light emitting layers"). However, there are currently no practical applications of strained light emitting layers in the field of light emitting diodes.

Patent Document 6 discloses the application of a quantum well structure to the light emitting unit of a light emitting diode. However, because the quantum effect obtained by utilizing a quantum well structure shortens the emission wavelength, this technique cannot be applied to techniques requiring wavelength lengthening.

PRIOR ART DOCUMENTS

Patent Documents

Patent Document 1: Japanese Unexamined Patent Application, First Publication No. Hei 9-37648
Patent Document 2: Japanese Unexamined Patent Application, First Publication No. 2002-27831
Patent Document 3: Japanese Unexamined Patent Application, First Publication No. 2004-221042
Patent Document 4: Japanese Patent (Granted) Publication No. 3,230,638
Patent Document 5: Japanese Unexamined Patent Application, First Publication No. 2000-151024
Patent Document 6: Japanese Patent (Granted) Publication No. 3,373,561

DISCLOSURE OF INVENTION

Problems to be Solved by the Invention

However, recent research has confirmed that when illumination is used for plant growth, energy conservation can be achieved by irradiating the plant with light, and subsequently extinguishing the light during the photosynthesis reaction. Accordingly, lighting methods that employ a high-speed pulse system in order to reduce electric power consumption are also being investigated. In other words, light emitting diodes having a rapid response time are required.

In particular, light emitting diodes used for high speed couplers used in electrical signal transmission in high voltage circuits and the like require a response time of 35 ns or less.

The present invention has been developed in light of the above circumstances, and has an object of providing a light emitting diode and a light emitting diode lamp that have a rapid response time.

Means to Solve the Problems

In other words, the present invention relates to the aspects described below.

(1) A light emitting diode containing a pn junction-type light emitting unit having a light emitting layer composed of n layers of a strained light emitting layer and n−1 layers of a barrier layer, wherein when a barrier layer exists, the light emitting layer has a structure in which one strained light emitting layer and one barrier layer are stacked alternately, the aforementioned n represents an integer of 1 to 7, and the thickness of the light emitting layer is not more than 250 nm.

(2) The light emitting diode according to (1), wherein the composition formula of the strained light emitting layer is $(Al_XGa_{1-X})_YIn_{1-Y}P$ (wherein $0 \leq X \leq 0.1$ and $0.37 \leq Y \leq 0.46$).

(3) The light emitting diode according to (1), wherein the composition formula of the strained light emitting layer is $Ga_XIn_{1-X}P$ (wherein $0.37 \leq X \leq 0.46$).

(4) The light emitting diode according to any one of (1) to (3), having a compound semiconductor layer containing at least the light emitting unit, and a strain adjustment layer laminated on the light emitting unit.

(5) The light emitting diode according to (4), wherein the compound semiconductor layer has a light extraction surface, and a functional substrate is bonded to the surface of the compound semiconductor layer positioned on the opposite side to the light extraction surface.

(6) The light emitting diode according to (5), wherein the functional substrate is a transparent substrate.

(7) The light emitting diode according to (5) or (6), wherein the material of the functional substrate is GaP.

(8) The light emitting diode according to any one of (5) to (7), further containing first and second electrodes provided on the light extraction surface side of the compound semiconductor layer, and a third electrode used for connection that is provided on the back surface of the functional substrate.

(9) The light emitting diode according to (5), wherein the compound semiconductor layer and the functional substrate are bonded together with a reflective structure disposed therebetween.

(10) The light emitting diode according to (5) or (9), wherein the material of the functional substrate is a metal.

(11) The light emitting diode according to (5) or (9), wherein the material of the functional substrate is any one of GaP, Si and Ge.

(12) The light emitting diode according to any one of (5) and (9) to (11), further containing a first electrode provided on the light extraction surface side of the compound semiconductor layer, and a second electrode provided between the compound semiconductor layer and a reflective structure.

(13) The light emitting diode according to any one of (1) to (12), wherein the thickness of the strained light emitting layer is within a range from 8 to 30 nm.

(14) The light emitting diode according to any one of (4) to (13), wherein the strain adjustment layer is a layer which is light transmittable wherein the light is emitted from the light emitting unit, and the strain adjustment layer has a lattice constant that is smaller than the lattice constants of the strained light emitting layer and the barrier layer.

(15) The light emitting diode according to any one of (1) to (14), wherein the composition formula of the barrier layer is $(Al_XGa_{1-X})_YIn_{1-Y}P$ (wherein $0.3 \le X \le 0.7$ and $0.48 \le Y \le 0.52$).

(16) The light emitting diode according to any one of (1) to (15), wherein the light emitting unit has a cladding layer on at least one of the upper and lower surfaces of the strained light emitting layer, and the composition formula of the cladding layer is $(Al_XGa_{1-X})_YIn_{1-Y}P$ (wherein $0.5 \le X \le 1$ and $0.48 \le Y \le 0.52$).

(17) The light emitting diode according to any one of (4) to (16), wherein the composition formula of the strain adjustment layer is $(Al_XGa_{1-X})_YIn_{1-Y}P$ (wherein $0 \le X \le 1$ and $0.6 \le Y \le 1$).

(18) The light emitting diode according to any one of (4) to (17), wherein the composition formula of the strain adjustment layer is $Al_XGa_{1-X}As_{1-Y}P_Y$ (wherein $0 \le X \le 1$ and $0.6 \le Y \le 1$).

(19) The light emitting diode according to any one of (4) to (18), wherein the material of the strain adjustment layer is GaP.

(20) The light emitting diode according to any one of (4) to (19), wherein the thickness of the strain adjustment layer is within a range from 0.5 to 20 μm.

(21) The light emitting diode according to any one of (5) to (20), wherein the side surface of the functional substrate has a vertical surface, which is positioned relatively closer to the compound semiconductor layer and is substantially perpendicular to the light extraction surface, and an inclined surface, which is positioned relatively distant from the compound semiconductor layer, is inclined inward relative to the light extraction surface, and is formed as an integrated structure with the vertical surface.

(22) The light emitting diode according to any one of (1) to (21), wherein the emission intensity of the strained light emitting layer at an emission wavelength of 700 nm is less than 10% of the emission intensity at the peak emission wavelength.

(23) The light emitting diode according to any one of (5) to (22), wherein the light extraction surface includes a rough surface.

(24) The light emitting diode according to any one of (1) to (23), which is used for promoting photosynthesis during plant growth, and wherein the peak emission wavelength within the emission spectrum of the light emitting unit is within a range from 655 to 675 nm.

(25) The light emitting diode according to (24), wherein the full width at half maximum of the emission spectrum is within a range from 10 to 40 nm.

(26) The light emitting diode according to any one of (1) to (25), wherein the response time of the light emitting unit is 35 ns or less.

(27) A light emitting diode lamp, including a mounting substrate having electrode terminals formed on the surface thereof, and the light emitting diode according to any one of (1) to (26), wherein the light emitting diode is mounted on the mounting substrate, and the light emitting diode is connected electrically to the electrode terminals.

(28) The light emitting diode lamp according to (27), wherein the first or second electrode provided on the light emitting diode, and the third electrode provided on the functional substrate are connected substantially equipotentially.

(2) to (26) represent preferred examples of the light emitting diode of (1), and

(28) represents a preferred example of the light emitting diode lamp of (27).

Effects of the Invention

According to one view of the present invention, by employing a light emitting diode containing a pn junction-type light emitting unit having a light emitting layer composed of n (>1) layers of a strained light emitting layer and n−1 layers of a barrier layer, wherein the light emitting layer has a structure in which one strained light emitting layer and one barrier layer are laminated alternately, n has a value of 1 to 7, and the thickness of the light emitting layer is not more than 250 nm, the total number of strained light emitting layers and barrier layers can be reduced, and the thickness of the light emitting layer composed of the strained light emitting layer(s) and barrier layer(s) can be reduced, enabling production of a light emitting diode having a response time of 35 ns or less.

Further, if a reflective structure is provided on the surface of the compound semiconductor layer positioned on the opposite side to the light extraction surface of the compound semiconductor layer, then of the light that is emitted outside the light emitting diode from the light extraction surface of the compound semiconductor layer, the intensity of the light in a direction orthogonal to the light extraction surface can be increased, enabling production of a light emitting diode having high brightness and high efficiency.

Furthermore, by increasing the intensity of light in a direction orthogonal to the light extraction surface, the power consumption of a light emitting diode having the same light intensity in the direction orthogonal to the light extraction surface as that of a light emitting diode not provided with a reflective structure can be reduced compared with the power consumption of the light emitting diode not provided with a reflective structure.

Further, by using a substrate having good thermal conductivity as the functional substrate that is bonded, via the reflective structure, to the surface of the compound semiconductor layer positioned on the opposite side to the light extraction surface, the heat that is generated during light emission from the light emitting unit can be efficiently dissipated through the functional substrate and outside the light emitting diode. A light emitting diode having this type of functional substrate is particularly effective for use in illumination for plant growth, where heat generation can be problematic.

EMBODIMENTS OF THE INVENTION

Figure 1:
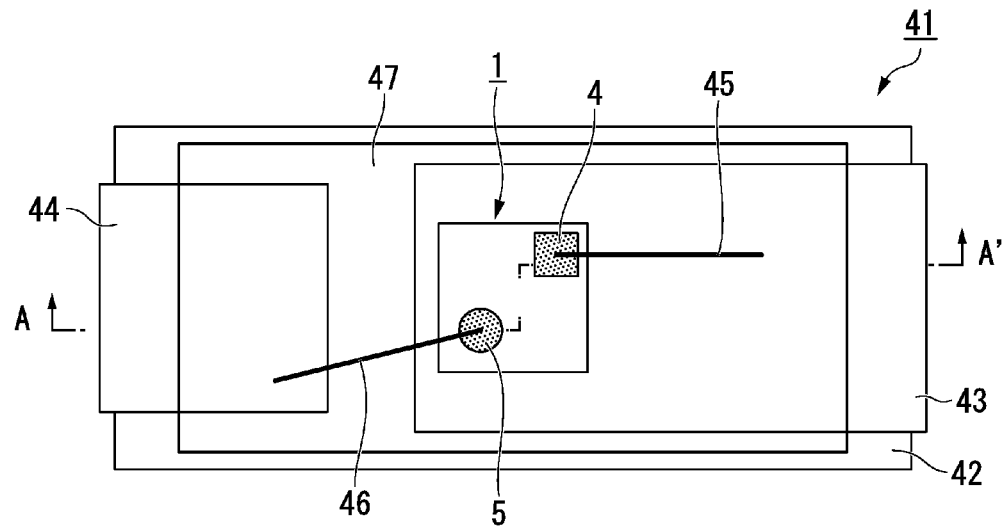
FIG. 1 is a plan view of a light emitting diode lamp containing a light emitting diode according to a first embodiment of the present invention.

A detailed description of a light emitting diode, which represents one embodiment of the application of the present invention, and a light emitting diode lamp that uses the light emitting diode are presented below with reference to the drawings. The drawings used in the following description have in some cases been drawn with certain features enlarged in order to assist with comprehension of those features, and as a result, the dimensional ratios or the like between each of the structural components in the drawings may not necessarily be the same as the ratios within the actual light emitting diode and light emitting diode lamp. Further, the present invention is in no way limited by the following examples. Modifications, additions and omissions of materials, numbers, positions, sizes, lengths and values and the like can be made without departing from the scope of the present invention. Further, the conditions and preferred examples described within each of the embodiments may also be used in the other embodiments.

<Light Emitting Diode Lamp>

Figure 2:
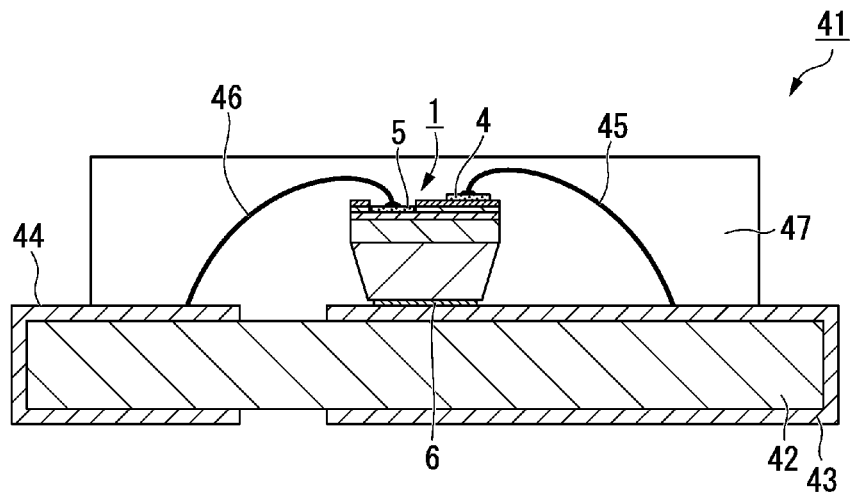
FIG. 2 is a schematic cross-sectional view of the light emitting diode lamp illustrated in FIG. 1 along the line A-A' in FIG. 1.

FIG. 1 is a plan view of a light emitting diode lamp containing a light emitting diode according to a first embodiment of the present invention, and FIG. 2 is a schematic cross-sectional view of the light emitting diode lamp illustrated in FIG. 1 along the line A-A' in FIG. 1.

As illustrated in FIG. 1 and FIG. 2, a light emitting diode lamp 41 containing a light emitting diode 1 of the present embodiment has a structure in which at least one light emitting diode 1 is mounted on the surface of a mounting substrate 42.

An n-electrode terminal 43 and a p-electrode terminal 44 are provided on the surface of the mounting substrate 42. Further, an n-type ohmic electrode 4 that acts as a first electrode for the light emitting diode 1 is connected to the n-electrode terminal 43 on the mounting substrate 42 using a gold wire 45. In other words, the n-type ohmic electrode 4 and the n-electrode terminal 43 are connected by wire bonding.

Further, a p-type ohmic electrode 5 that acts as a second electrode for the light emitting diode 1 is connected electrically to the p-electrode terminal 44 on the mounting substrate 42 using a gold wire 46.

Moreover, as illustrated in FIG. 2, a third electrode 6 is provided on the surface of the light emitting diode 1 positioned on the opposite side to the surface on which the n-type ohmic electrode 4 and the p-type ohmic electrode 5 are provided. The light emitting diode 1 is connected to the n-electrode terminal 43 and secured to the mounting substrate 42 by this third electrode 6. The n-type ohmic electrode 4 and the third electrode 6 are connected electrically via the n-electrode terminal 43 so as to be equipotential or substantially equipotential. The surface of the mounting substrate 42 on which the light emitting diode 1 is mounted is sealed using a typical epoxy resin 47.

<Light Emitting Diode(First Embodiment)>

Figure 3:
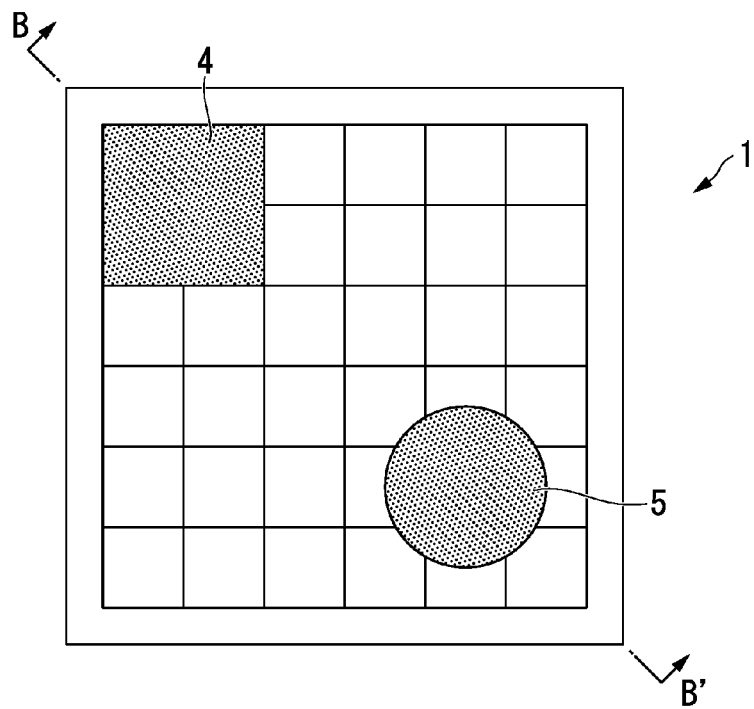
FIG. 3 is a plan view of the light emitting diode illustrated in FIG. 1.
Figure 4:
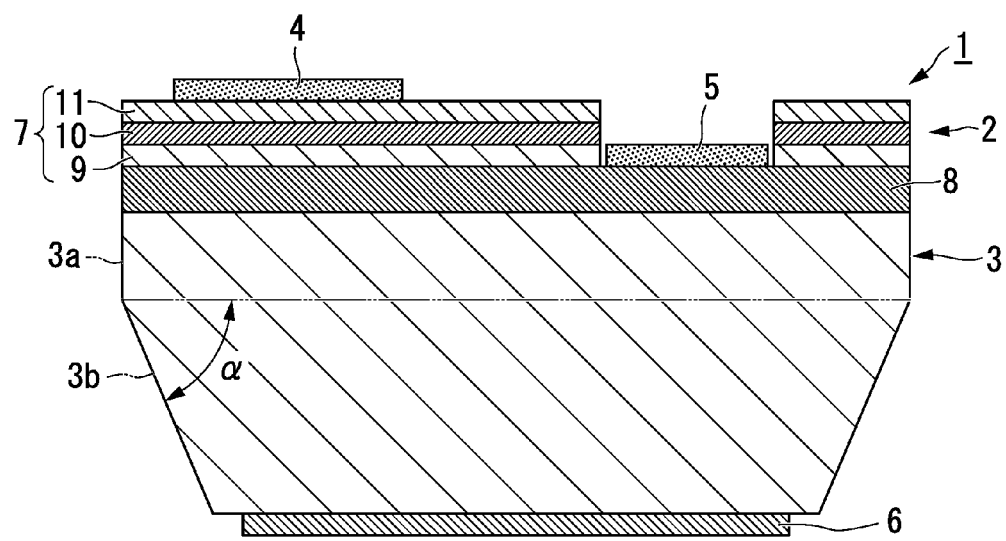
FIG. 4 is a schematic cross-sectional view of the light emitting diode illustrated in FIG. 3 along the line B-B' in FIG. 3.

FIG. 3 is a plan view of the light emitting diode illustrated in FIG. 1, and FIG. 4 is a schematic cross-sectional view of the light emitting diode illustrated in FIG. 3 along the line B-B' in FIG. 3.

As illustrated in FIG. 3 and FIG. 4, the light emitting diode 1 of this embodiment has a structure in which a compound semiconductor layer 2 is bonded to a functional substrate 3. The light emitting diode 1 includes an n-type ohmic electrode 4 (first electrode) and a p-type ohmic electrode 5 (second electrode) provided on a main light extraction surface, and a third electrode 6 provided on the opposite surface of the functional substrate 3 to the surface that is bonded to the compound semiconductor layer 2. In this embodiment, the main light extraction surface refers to the surface of the compound semiconductor layer 2 on the opposite side to the surface bonded to the functional substrate 3.

As illustrated in FIG. 4, the compound semiconductor layer 2 (also referred to as the epitaxial growth layer) has a structure in which a pn junction-type light emitting unit 7 and a strain adjustment layer 8 are laminated sequentially.

The structure of this compound semiconductor layer 2 may also include conventional functional layers when required. For example, conventional layers such as a contact layer for reducing the contact resistance of the ohmic electrodes, an electric current diffusion layer for achieving planar diffusion of the device drive current across the entire light emitting unit, or in contrast, a current inhibition layer or current constriction layer for restricting the region through which the diode drive current is able to flow, may be provided. The compound semiconductor layer 2 is preferably formed by epitaxial growth on top of a GaAs substrate.

As illustrated in FIG. 4, the light emitting unit 7 is formed by sequentially laminating at least a p-type lower cladding layer 9, a light emitting layer 10 and an n-type upper cladding layer 11 on the strain adjustment layer 8. In other words, in terms of obtaining high-intensity light emission, the light emitting unit 7 is preferably a so-called double hetero (abbreviation: DH) structure including a lower cladding layer 9 and an upper cladding layer 11, which are positioned in opposing positions on the lower and upper sides of the light emitting layer 10 to "confine" emitted light and carriers that give rise to radiative recombination within the light emitting layer 10.

Figure 5:
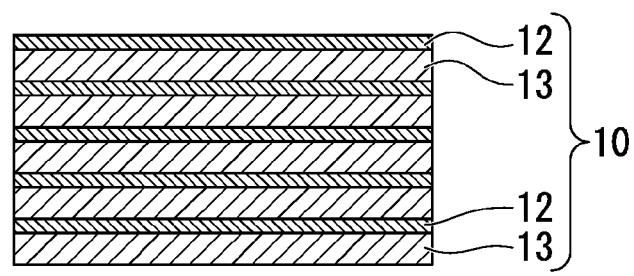
FIG. 5 is an enlarged cross-sectional view describing the structure of the light emitting layer illustrated in FIG. 4.

As illustrated in FIG. 5, the light emitting layer 10 has a stacked structure in which strained light emitting layers 12 and barrier layers 13 are laminated in an alternating manner, with a strained light emitting layer 12 positioned at each of the two outer edges of the structure.

Each of the strained light emitting layers 12 has a composition represented by $(Al_XGa_{1-X})_YIn_{1-Y}P$ (wherein $0 \leq X \leq 1$ and $0 < Y \leq 1$). The value of X is preferably not more than 0.1, and is more preferably 0. Further, the value of Y is preferably within a range from 0.37 to 0.46, and more preferably within a range from 0.39 to 0.45.

By specifying that the composition of the strained light emitting layer 12 satisfies the above-mentioned ranges, an emission wavelength within a range from 655 to 675 nm can be achieved. However, in such cases, the strained light emitting layer 12 adopts a structure having a different lattice constant from the other structural portions, resulting in the development of strain in the compound semiconductor layer 2. As a result, there is a possibility that detrimental crystal defects may occur.

The thickness of the strained light emitting layer 12 (namely, the thickness of one layer) is preferably within a range from 8 to 30 nm. If the strained light emitting layer 12 is a thin film with a thickness of less than approximately 6 nm, then a quantum effect of the well structure causes a shortening of the emission wavelength, making it impossible to achieve the desired emission wavelength of 655 nm or greater.

Accordingly, allowing for fluctuation in the thickness, the thickness of the strained light emitting layer 12 is preferably at least 8 nm in order to prevent quantum effects. In consideration of ease of control of the thickness, a thickness of at least 10 nm is preferred. On the other hand, if the thickness of the strained light emitting layer 12 exceeds 30 nm, then the amount of strain tends to become too great, which increases the likelihood of crystal defects and surface anomalies, and is therefore undesirable.

Each of the barrier layers 13 has a composition represented by $(Al_XGa_{1-X})_YIn_{1-Y}P$ (wherein $0 \leq X \leq 1$ and $0 < Y \leq 1$). The value of X is preferably within a range from 0.3 to 0.7, and is more preferably within a range from 0.4 to 0.6. Further, the value of Y is preferably within a range from 0.48 to 0.52, and more preferably within a range from 0.49 to 0.51. Further, the lattice constant of the barrier layer 13 is typically the same as, or less than, that of the GaAs substrate.

The thickness of the barrier layer 13 (namely, the thickness of one layer) is preferably greater than the thickness of the strained light emitting layer 12. This enables the light emission efficiency of the strained light emitting layer 12 to be increased. Further, as well as optimizing the light emission efficiency, the barrier layer 13 must also alleviate the strain generated within the strained light emitting layer 12.

Accordingly, the thickness of the barrier layer 13 is preferably at least 15 nm or more, and is more preferably 20 nm or greater. On the other hand, if the thickness of the barrier layer 13 exceeds 50 nm, then it approaches the emission wavelength, and optical effects may arise such as light interference, Bragg reflection and the like.

Accordingly, the thickness of the barrier layer 13 is preferably not more than 50 nm, and more preferably 40 nm or less. As mentioned above, adopting a structure in which the strained light emitting layer 12 is relatively thinner and the barrier layer 13 is relatively thicker enables the strain of the strained light emitting layer 12 to be absorbed by the barrier layer 13, reducing the likelihood of crystal defects in the strained light emitting layer 12.

In the light emitting layer 10 having the laminated strained light emitting layer 12 and barrier layer 13, the number of strained light emitting layers 12 (the number n of laminated layers ($n \geq 1$)) is typically from 1 to 7. In this case, the number of barrier layers 13 (the number (n−1) of laminated layers) is from 0 to 6 (a number one fewer than the number n of laminated layers of the strained light emitting layer 12).

As the numbers of the strained light emitting layers 12 and the barrier layers 13 are reduced, the junction capacitance of the pn junction increases. This is because, as described below, the strained light emitting layer 12 and the barrier layer 13 are either undoped or have a low carrier concentration, and therefore they function as depletion layers in the pn junction, with a thinner depletion layer yielding a larger capacitance.

It is generally considered that a smaller capacitance is desirable for shortening the response time, but in the structure of the present invention, it was discovered that the response time could be shortened by reducing the number of layers of the strained light emitting layer 12 and the barrier layer 13, despite the accompanying increase in the capacitance.

It is thought that this is because the increase in the rate of injected carrier recombination achieved by reducing the numbers of the strained light emitting layer 12 and the barrier layer 13 is a more significant effect.

When the number n of laminated layers of the strained light emitting layer 12 is set to one, carrier overflow tends to occur at the high current side of the working current, resulting in a reduction in the light emission efficiency at the high current side. Further, if the number n of laminated layers of the strained light emitting layer 12 exceeds eight, then the desired response time (specifically, a response time of 35 ns or less) cannot be achieved.

The number n of laminated layers of the strained light emitting layer 12 within the light emitting layer 10 is preferably from 2 to 5.

In such cases, the number (n−1) of laminated layers of the barrier layer 13 is from 1 to 4 (a number one fewer than the number n of laminated layers of the strained light emitting layer 12).

Further, the thickness of the light emitting layer 10 including the 1 to 7 strained light emitting layers 12 and the corresponding number of barrier layers 13 is not more than 250 nm.

In this manner, by forming the light emitting layer 10 from n (>1) strained light emitting layers 12 and (n−1) barrier layers 13 so that one strained light emitting layer 12 and one barrier layer 13 are laminated in an alternating arrangement, setting n to a value of 1 to 7, and ensuring that the thickness of the light emitting layer 10 is not more than 250 nm, the number of laminated layers of the strained light emitting layer 12 and the barrier layer 13 can be reduced, and the thickness of the light emitting layer 10 composed of the strained light emitting layer 12 and the barrier layer 13 can be reduced, thus enabling production of a light emitting diode 1 having a response time of 35 nm or less (namely, a light emitting diode having a rapid response time).

This type of light emitting diode 1 having a rapid response time can be used as a light emitting diode for plant growth, or as a light emitting diode for a high speed coupler used in electrical signal transmission within a high voltage circuit or the like.

There are no particular limitations on the type of conductivity of the light emitting layer 10, and any of undoped, p-type or n-type conductivity may be selected. In order to enhance the light emission efficiency, it is preferable to either use an undoped light emitting layer having god crystallinity, or restrict the carrier concentration to less than $3 \times 10^{17}$ cm$^{-3}$.

By including the strained light emitting layer 12 having a composition formula of $(Al_XGa_{1-X})_YIn_{1-Y}P$ (wherein 0≤X≤0.1 and 0.37≤Y≤0.46), the peak emission wavelength within the emission spectrum of the light emitting layer 10 can be set within a range from 655 to 675 nm, and the peak emission wavelength is preferably set within a range from 660 to 670 nm.

An emission wavelength within the range from 655 to 675 nm is known to be an emission wavelength that is suitable as a light source for plant growth (photosynthesis), and exhibits a high degree of reaction efficacy for photosynthesis.

On the other hand, if light within the long wavelength region of 700 nm or greater is used, then a reaction that inhibits plant growth occurs, and therefore the amount of light within this long wavelength region is preferably minimized.

Accordingly, in order to achieve efficient plant growth, red light sources for which the intensity of light within the wavelength region from 655 to 675 nm that is ideal for promoting photosynthesis is strong, but which include no light in the long wavelength region of 700 nm or greater, are the most desirable.

Furthermore, in order to achieve the type of desirable red light source described above, the full width at half maximum of the emission spectrum must be narrow. On the other hand, the full width at half maximum narrows close to quantization conditions, which tend to increase the possibility of wavelength fluctuations, and as a result, the full width at half maximum of the emission spectrum is preferably within a range from 10 to 40 nm.

Moreover, the emission intensity within the emission spectrum at an emission wavelength of 700 nm is preferably less than 10% of the emission intensity at the aforementioned peak emission wavelength.

A light emitting diode 1 having a light emitting layer 10 with the types of properties described above can be used favorably as illumination (a light emitting diode lamp) for promoting photosynthesis during plant growth. Further, in terms of the structure of the light emitting layer 10, the composition, thickness and number of layers may be selected appropriately so as to satisfy the above properties.

As illustrated in FIG. 4, the lower cladding layer 9 and the upper cladding layer 11 are provided on the lower surface and the upper surface respectively of the light emitting layer 10. Specifically, the lower cladding layer 9 is provided on the lower surface of the light emitting layer 10, and the upper cladding layer 11 is provided on the upper surface of the light emitting layer 10.

The material for the lower cladding layer 9 and the upper cladding layer 11 is preferably a material that has a larger band gap than the light emitting layer 10 (specifically, the strained light emitting layer 12), and a material that has a larger band gap than the barrier layer 13 is more preferred.

Examples of such materials include compounds having a composition represented by $Al_XGa_{1-X}As$ and compounds having a composition represented by $(Al_XGa_{1-X})_YIn_{1-Y}P$ (wherein 0≤X≤1 and 0<Y≤1). In the above formulas, the value of X preferably has a lower limit of at least 0.3, and more preferably 0.5 or greater. Further, the value of Y is preferably within a range from 0.48 to 0.52, and more preferably within a range from 0.49 to 0.51.

The lower cladding layer 9 and the upper cladding layer 11 are formed with different polarities. Further, the carrier concentration and thickness of both the lower cladding layer 9 and the upper cladding layer 11 may be set within conventionally preferred ranges, and these conditions are preferably optimized so as to maximize the light emission efficiency of the light emitting layer 10. Furthermore, warping of the compound semiconductor layer 2 can also be reduced by controlling the composition of the lower cladding layer 9 and the upper cladding layer 11.

Specifically, for the lower cladding layer 9, the use of a semiconductor material composed of a Mg-doped p-type $(Al_XGa_{1-X})_YIn_{1-Y}P$ (wherein 0.3≤X≤1 and 0<Y≤1) is preferred. Further, the carrier concentration is preferably within a range from $2 \times 10^{17}$ to $2 \times 10"$ cm$^{-3}$, and the thickness is preferably within a range from 0.5 to 5 μm.

On the other hand, for the upper cladding layer 11, the use of a semiconductor material composed of a Si-doped n-type $(Al_XGa_{1-X})_YIn_{1-Y}P$ (wherein 0.3≤X≤1 and 0<Y≤1) is preferred. Further, the carrier concentration is preferably within a range from $1 \times 10^{17}$ to $1 \times 10^{18}$ cm$^{-3}$, and the thickness of the upper cladding layer 11 is preferably within a range from 0.5 to 2 μm. The polarities of the lower cladding layer 9 and the upper cladding layer 11 may be selected with due consideration of the structure of the compound semiconductor layer 2.

Further, intermediate layers may be provided between the lower cladding layer 9 and the light emitting layer 10, between the light emitting layer 10 and the upper cladding layer 11, and between the upper cladding layer 11 and the strain adjustment layer 8, in order to ensure gradual change of the band discontinuity between the various sets of layers. In such cases, each of the intermediate layers is preferably formed from a semiconductor material having a forbidden bandwidth that is midway between that of the two layers.

Furthermore, conventional layer structures such as a contact layer for reducing the contact resistance of the ohmic electrodes, an electric current diffusion layer for achieving planar diffusion of the diode drive current across the entire light emitting unit, or in contrast, a current inhibition layer or current constriction layer for restricting the region through which the device drive current is able to flow, may be provided at the above side of the layers of the light emitting unit 7.

As illustrated in FIG. 4, the strain adjustment layer 8 is provided beneath the light emitting unit 7. This strain adjustment layer 8 is provided for the purpose of alleviating the strain that is produced due to the strained light emitting layer 12 during epitaxial growth of the compound semiconductor layer 2 on the GaAs substrate.

Further, the strain adjustment layer 8 can transmit the emission wavelength (light) from the light emitting unit 7 (specifically, the light emitting layer 10). Moreover, the strain adjustment layer 8 has a lattice constant that is smaller than the lattice constants of the strained light emitting layer 12 and the barrier layer 13.

Furthermore, the strain adjustment layer 8 has a lattice constant that is smaller than the lattice constant of the GaAs substrate used during formation (namely, formation by epitaxial growth) of the compound semiconductor layer 2. More specifically, if the lattice constant of the strain adjustment layer 8 having the composition described below is termed A, the lattice constant of the barrier layer 13 is termed 13, and the lattice constant of the strained light emitting layer 12 is termed C, then these lattice constants satisfy the relationship A<B<C.

As the strain adjustment layer 8, a material having a composition represented by $(Al_XGa_{1-X})_YIn_{1-Y}P$ (wherein $0 \leq X \leq 1$ and $0.6 \leq Y \leq 1$) can be used. The value of X varies depending on the structure of the compound semiconductor layer 2, but because materials having a low Al concentration are chemically stable, X is preferably not more than 0.5, and is most preferably 0. Further, the lower limit for Y is preferably 0.6 or more.

If a comparison is made between structures in which the amount of strain within the light emitting layer 10 (the strained light emitting layers 12) is the same, then a smaller value of Y results in a reduction in the size of the strain adjustment effect provided by the strain adjustment layer 8. This means that the thickness of the strain adjustment layer 8 must be increased, resulting in increased time and cost for deposition of the strain adjustment layer 8, and therefore the value of Y is preferably 0.6 or greater, and is more preferably 0.8 or greater.

Further, a group 111-V semiconductor material that can transmit light of the emission wavelength and has a composition represented by $Al_XGa_{1-X}As_{1-Y}P_Y$ (wherein $0 \leq X \leq 1$ and $0.6 \leq Y \leq 1$) may also be used favorably as the strain adjustment layer 8.

In the case of a strain adjustment layer 8 having this composition, the lattice constant varies depending on the value of Y. Larger values of Y result in a smaller lattice constant. Further, the degree of transparency relative to the emission wavelength is related to the values of both X and Y, and therefore the values of X and Y are preferably selected so as to achieve a transparent material.

Moreover, GaP, and preferably Mg-doped p-type GaP or the like, may also be used favorably as the material of the strain adjustment layer 8. This GaP requires no adjustment of the composition and also exhibits a large strain adjustment effect, and is therefore the most preferred material for the strain adjustment layer 8 in terms of productivity and stability.

The strain adjustment layer 8 has a smaller lattice constant than the lattice constant of the GaAs substrate that functions as the substrate used for epitaxial growth of the compound semiconductor layer 2, and therefore has the ability to alleviate fluctuations in the amount of strain incorporated within the strained light emitting layer 12. Accordingly, providing the strain adjustment layer 8 has the effects of improving the uniformity of properties such as the emission wavelength, and preventing the occurrence of crystal defects such as cracks.

The thickness of the strain adjustment layer 8 is preferably within a range from 0.5 to 20 μm, and is more preferably within a range from 3 to 15 μm. If the thickness of the strain adjustment layer 8 is less than 0.5 μm, then the thickness is insufficient to alleviate fluctuations in the amount of strain incorporated within the strained light emitting layer 12, whereas if the thickness exceeds 20 μm, then the growth time becomes overly long, and the production costs increase undesirably.

Furthermore, by controlling the composition of the strain adjustment layer 8, warping of the compound semiconductor layer 2 can be reduced, and therefore a light emitting diode 1 having a narrow in-plane wavelength distribution can be produced.

Moreover, in cases such as the present embodiment, which employ a structure in which the functional substrate 3 and the compound semiconductor layer 2 are bonded together, if the amount of warping of the compound semiconductor layer 2 is large, then problems such as cracking may occur, and therefore it is desirable to minimize warping of the compound semiconductor layer 2.

For example, the strained light emitting layer 12 is preferably a thin film having a thickness of not more than 30 nm, but being a thin film, controlling the thickness to achieve uniform thickness is problematic. Because there is a correlation between the thickness and the amount of introduced strain, fluctuations in the thickness of the strained light emitting layer 12 cause fluctuations in the amount of introduced strain, resulting in fluctuations in the emission wavelength of the strained light emitting layer 12.

It was discovered that, during formation of the compound semiconductor layer 2, by providing the strain adjustment layer 8 on t the light emitting unit 7 (shown beneath the light emitting unit 7 in FIG. 4) which contains the strained light emitting layer 12 having + (positive) strain, the − (negative) strain of this strain adjustment layer 8 has the effect of bringing the strain that had deviated significantly toward the + side as a result of fluctuation in the thickness of the strained light emitting layer 12 back toward the − side, thereby reducing the fluctuation in the amount of strain within the strained light emitting layer 12. This effect of the strain adjustment layer 8 operates in a similar manner in those cases where the cause of the fluctuation in the amount of strain in the strained light emitting layer 12 is fluctuation in the composition of the strained light emitting layer 12.

In the structure of a conventional light emitting diode that lacks the strain adjustment layer 8, because large fluctuations occur in properties such as the emission wavelength, it has proven difficult to satisfy quality requirements. In contrast, the light emitting diode 1 of the present embodiment has a diode structure that includes the strain adjustment layer 8 provided below the light emitting unit 7.

As a result, the amount of strain within the strained light emitting layer 12 that is required to achieve the desired wavelength lengthening can be made more uniform throughout the light emitting layer 10, thereby reducing fluctuations in the emission wavelength and the output properties. Further, the surface state of the compound semiconductor layer 2 is also improved.

As illustrated in FIG. 4, the functional substrate 3 is bonded to the compound semiconductor layer 2 on the side of the strain adjustment layer 8. The functional substrate 3 is an optically transparent substrate, and is formed from a material that has sufficient strength to mechanically support the light emitting unit 7, has a broad forbidden band width that enables transmission of the light emitted from the light emitting unit 7, and is optically transparent to the emission wavelength from the light emitting layer 10.

For example, the functional substrate 3 may be formed from group III-V compound semiconductor crystals such as gallium phosphide (GaP), aluminum gallium arsenide (Al-GaAs) and gallium nitride (GaN), group II-VI compound semiconductor crystals such as zinc sulfide (ZnS) and zinc selenide (ZnSe), group IV semiconductor crystals such as hexagonal or cubic silicon carbide (SiC), or insulating substrates such as glass and sapphire.

On the other hand, a functional substrate having a highly reflective surface at the bonding surface may also be selected. For example, a metal substrate or alloy substrate of silver, gold, copper or aluminum or the like, or a composite substrate in which a metal mirror structure is formed on a semiconductor may be selected. Selection of a similar material to the strain adjustment layer, which ensures no strain effects as a result of the bonding, is the most desirable.

In order to enable the functional substrate 3 to support the light emitting unit 7 mechanically with a satisfactory degree of strength, the thickness of the functional substrate 3 is preferably not less than approximately 50 µm. Further, in order to facilitate mechanical processing of the functional substrate 3 following bonding to the compound semiconductor layer 2, the thickness of the functional substrate 3 preferably does not exceed approximately 300 µm. In other words, the functional substrate 3 is most preferably formed from an n-type GaP substrate having a thickness of not less than approximately 50 µm and not more than approximately 300 µm.

Furthermore, as illustrated in FIG. 4, the side surface of the functional substrate 3 includes a vertical surface 3a that is positioned relatively closer to the compound semiconductor layer 2 and is substantially perpendicular to the main light extraction surface, and an inclined surface 3b that is positioned relatively distant from the compound semiconductor layer 2 and is inclined inward relative to the main light extraction surface.

This structure enables light emitted toward the functional substrate 3 from the light emitting layer 10 to be extracted externally with good efficiency. Further, of the light emitted toward the functional substrate 3 from the light emitting layer 10, a portion of the light is reflected off the vertical surface 3a and can be extracted at the inclined surface 3b.

On the other hand, light reflected off the inclined surface 3b can be extracted at the vertical surface 3a. In this manner, a synergistic effect between the vertical surface 3a and the inclined surface 3b enables the light extraction efficiency to be enhanced.

Further, in this embodiment, as illustrated in FIG. 4, an angle α between the inclined surface 3b and a surface parallel to the light emission surface is preferably set within a range from 55 to 80 degrees. By employing an angle within this range, light reflected off the bottom of the functional substrate 3 can be extracted externally with good efficiency.

Furthermore, the width (in the thickness direction) of the vertical surface 3a is preferably within a range from 30 to 100 µm. By ensuring that the width of the vertical surface 3a satisfies this range, light reflected off the bottom of the functional substrate 3 can be returned efficiently through the vertical surface 3a to the light emission surface, and can then be emitted from the main light extraction surface. As a result, the light emission efficiency of the light emitting diode 1 can be enhanced.

Furthermore, the inclined surface 3b of the functional substrate 3 is preferably subjected to a surface roughening treatment. Roughening the inclined surface 3b results in improved light extraction efficiency at the inclined surface 3b. In other words, by roughening the inclined surface 3b, total reflection at the inclined surface 3b is inhibited, enabling the light extraction efficiency to be improved.

The bonding interface between the compound semiconductor layer 2 and the functional substrate 3 may sometimes act as a high-resistance layer. In other words, a high-resistance layer, which is not shown in the drawings, may sometimes be provided between the compound semiconductor layer 2 and the functional substrate 3. This high-resistance layer has a higher resistance than the functional substrate 3, and when provided, has a function of reducing reverse current flow from the strain adjustment layer 8 side of the compound semiconductor layer 2 toward the functional substrate 3. Further, although the high-resistance layer has a bonding structure that exhibits favorable withstand voltage properties relative to voltages inadvertently applied in the reverse direction from the functional substrate 3 to the strain adjustment layer 8, the bonding structure is preferably such that the breakdown voltage is a lower value than the reverse direction voltage for the pn junction-type light emitting unit 7.

The n-type ohmic electrode 4 and the p-type ohmic electrode 5 are low-resistance ohmic contact electrodes provided on the main light extraction surface of the light emitting diode 1. In this embodiment, the n-type ohmic electrode 4 is provided on the upper cladding layer 11, and can be formed using AuGe or an alloy composed of a Ni alloy and Au. On the other hand, as illustrated in FIG. 4, the p-type ohmic electrode 5 is formed on the exposed surface of the strain adjustment layer 8, and is formed using an alloy composed of AuBe and Au.

In the light emitting diode 1 of the present embodiment, the p-type ohmic electrode 5 that functions as the second electrode is preferably formed on the strain adjustment layer 8. By employing this type of structure, the operating voltage can be reduced. Further, by forming the p-type ohmic electrode 5 on a strain adjustment layer 8 composed of p-type GaP, a favorable ohmic contact can be achieved, enabling a further reduction in the operating voltage.

In the present embodiment, the polarity of the first electrode is preferably n-type, and the polarity of the second electrode is preferably p-type. Using this type of structure enables a higher brightness to be achieved for the light emitting diode 1.

On the other hand, if the polarity of the first electrode is p-type, then current diffusion deteriorates and the brightness tends to decrease. In contrast, by making the first electrode an n-type electrode, current diffusion is improved, and a higher brightness light emitting diode 1 can be achieved.

As illustrated in FIG. 3, in the light emitting diode 1 of the present embodiment, the n-type ohmic electrode 4 and the p-type ohmic electrode 5 are preferably disposed in diagonally opposing positions. Further, the periphery of the p-type ohmic electrode 5 is preferably surrounded by the compound semiconductor layer 2.

By adopting this type of structure, the operating voltage can be reduced. Further, surrounding the p-type ohmic electrode 5 on all sides with the n-type ohmic electrode 4 facilitates the flow of electric current in all directions, resulting in a reduction in the operating voltage.

Furthermore, as illustrated in FIG. 3, in the light emitting diode 1 of the present embodiment, the n-type ohmic electrode 4 is preferably formed as a mesh-like structure such as a honeycomb or grid.

Adopting this type of structure enables the reliability to be improved. Further, using a grid-like structure enables current to be introduced more uniformly into the light emitting layer 10, resulting in improved reliability.

In the light emitting diode 1 of this embodiment, the n-type ohmic electrode 4 is preferably formed from a pad-shaped electrode (a pad electrode) and a linear electrode with a width of not more than 10 µm (a linear electrode).

This type of structure enables a higher level of brightness to be obtained. Moreover, by ensuring a narrow width for the linear electrode, the open surface area of the light extraction surface can be increased, enabling a higher level of brightness to be achieved.

As illustrated in FIG. 4, the third electrode 6 is provided on the bottom surface of the functional substrate 3, and has the functions of increasing the brightness, providing conductivity, and improving the stability of the mounting step. There are no particular limitations on the material used for the third electrode 6, and for example, a highly reflective silver (Ag) paste can be used.

Further, a laminated structure composed of for example, a reflective layer, a barrier layer and a connection layer can also be used as the third electrode 6. Examples of materials that may be used as the reflective layer include highly reflective metals such as silver, gold, aluminum and platinum, as well as alloys of these metals.

Furthermore, an oxide film formed from a transparent conductive film such as indium tin oxide (ITO) or indium zinc oxide (IZO) may be provided between the functional substrate 3 and the reflective layer of the electrode 6. Examples of materials that may be used for the barrier layer include high-melting point metals such as tungsten, molybdenum, titanium, platinum, chromium and tantalum. Further, examples of materials that may be used as the connection layer include low-melting point eutectic metals such as AuSn, AuGe and AuSi.

Further, the third electrode 6 may be either an ohmic electrode or a Schottky electrode, but if the third electrode 6 is formed as an ohmic electrode on the bottom surface of the functional substrate 3, then the electrode tends to absorb light from the light emitting layer 10, and therefore a Schottky electrode is preferred.

Although there are no particular limitations on the thickness of the third electrode 6, the thickness is preferably within a range from 0.2 to 5 µm, more preferably within a range from 1 to 3 µm, and most preferably within a range from 1.5 to 2.5 µm.

If the thickness of the third electrode 6 is less than 0.2 µm, then high-level thickness control technology is required, which is undesirable. In contrast, if the thickness of the third electrode 6 exceeds 5 µm, then pattern formation becomes difficult, and the costs tend to increase, both of which are undesirable. On the other hand, if the thickness of the third electrode 6 satisfies the aforementioned range, a favorable combination of quality stability and cost can be achieved.

<Method of Producing Light Emitting Diode>

Figure 6:
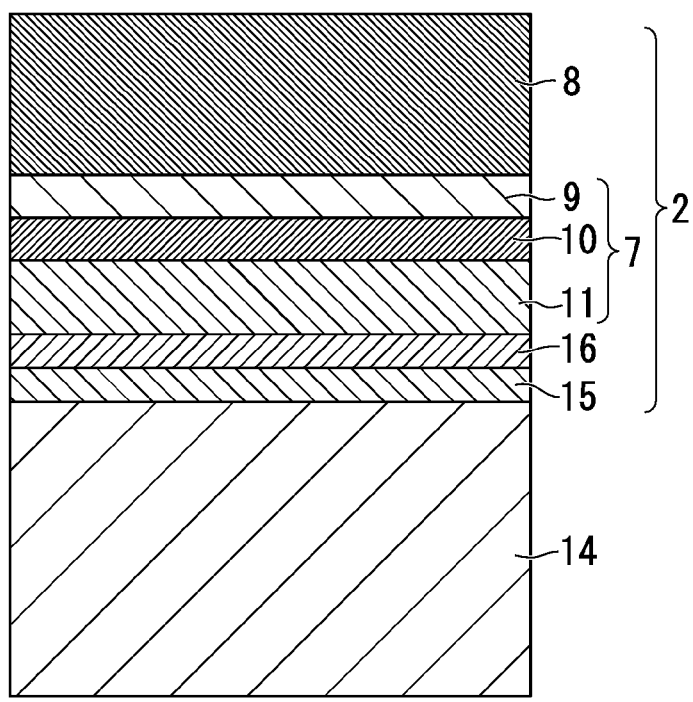
FIG. 6 is a schematic cross-sectional view of an epiwafer used in a light emitting diode according to an embodiment of the present invention.
Figure 7:
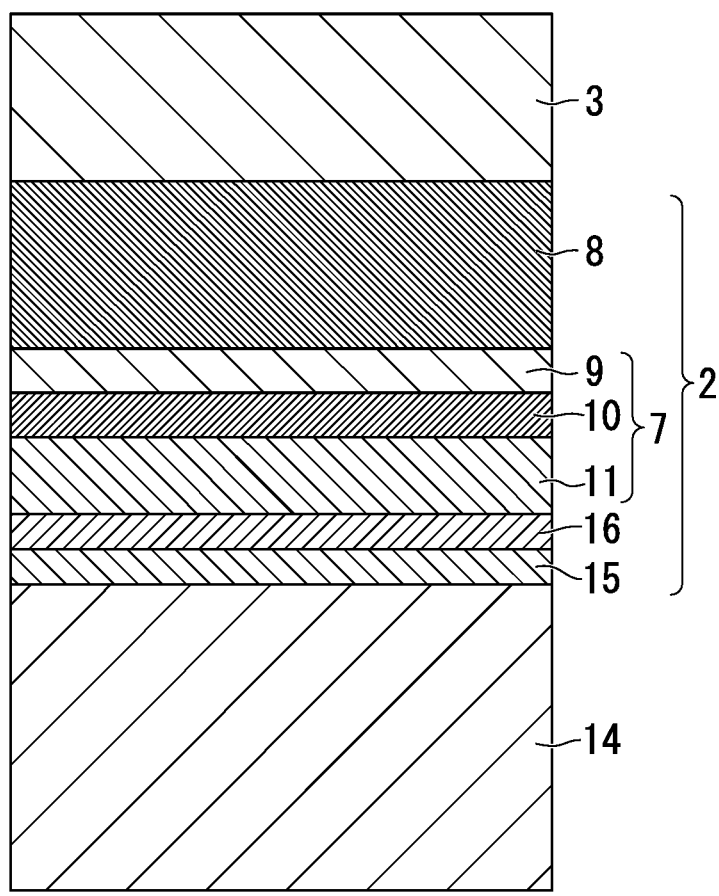
FIG. 7 is a schematic cross-sectional view of a bonded wafer used in a light emitting diode according to an embodiment of the present invention.

FIG. 6 is a schematic cross-sectional view of an epiwafer used in the light emitting diode 1 according to the present embodiment, and FIG. 7 is a schematic cross-sectional view of a bonded wafer used in the light emitting diode 1 according to the present embodiment.

A method of producing the light emitting diode 1 of the present embodiment is described below with reference to FIG. 6 and FIG. 7.

(Compound Semiconductor Layer Formation Step)

First, as illustrated in FIG. 6, the compound semiconductor layer 2 is prepared.

The compound semiconductor layer 2 is formed by sequentially laminating, on top of a GaAs substrate 14, a buffer layer 15 formed from GaAs, an etching stop layer (not shown in the figure) that is provided to enable the use of selective etching, a contact layer 16 formed from Si-doped n-type AlGaInP, the n-type upper cladding layer 11, the light emitting layer 10, the p-type lower cladding layer 9, and the strain adjustment layer 8 formed from Mg-doped p-type GaP.

The GaAs substrate 14 may use a commercially available monocrystalline substrate produced using conventional production methods. The surface of the GaAs substrate 14 upon which epitaxial growth is to be performed is preferably smooth. The planar orientation of the surface of the GaAs substrate 14 is preferably those of the mass-produced (100) plane or the plane wherein planar orientation thereof is inclined within a range of ±20° as compared with the (100) plane in terms of quality stability and facilitating epitaxial growth.

Moreover, the planar orientation of the surface of the GaAs substrate 14 is more preferably inclined within a range of 15°±5° as compared with the (100) direction toward the (0-1-1) direction.

In order to improve the crystallinity of the compound semiconductor layer 2, the dislocation density of the GaAs substrate 14 is preferably low. Specifically, the dislocation density is typically not more than 10,000 $cm^{-2}$, and preferably not more than 1,000 $cm^{-2}$.

The type of conductivity of the GaAs substrate 14 may be either n-type or p-type conductivity. The carrier concentration of the GaAs substrate 14 may be selected as appropriate in order to achieve the desired electrical conductivity and diode structure. For example, in the case where the GaAs substrate 14 is a silicon-doped n-type substrate, the carrier concentration is preferably within a range from $1 \times 10^{17}$ to $5 \times 10^{18}$ $cm^{-3}$. In contrast, in the case where the GaAs substrate 14 is a zinc-doped p-type substrate, the carrier concentration is preferably within a range from $2 \times 10^{18}$ to $5 \times 10^{19}$ $cm^{-3}$.

The thickness of the GaAs substrate 14 may be set within an appropriate range in accordance with the substrate size. If the thickness of the GaAs substrate 14 is thinner than this appropriate range, then there is a danger of breakage occurring during the production process for the compound semiconductor layer 2.

In contrast, if the thickness of the GaAs substrate 14 is thicker than the appropriate range, then the material costs increase. Accordingly, in those cases where the substrate size of the GaAs substrate 14 is large, for example in the case of a GaAs substrate 14 having a diameter of 75 mm, the substrate thickness is preferably within a range from 250 to 500 µm in order to prevent breakage during handling. Similarly, if the diameter of the GaAs substrate 14 is 50 mm, then the thickness is preferably within a range from 200 to 400 µm, whereas if the diameter of the GaAs substrate 14 is 100 mm, the thickness is preferably within a range from 350 to 600 µm.

In this manner, by setting the thickness of the GaAs substrate 14 in accordance with the substrate size, warping of the compound semiconductor layer 2 caused by the strained light emitting layer 7 can be reduced.

As a result, the temperature distribution during epitaxial growth becomes more uniform, meaning the wavelength distribution within the plane of the light emitting layer 10 can be narrowed. The shape of the GaAs substrate 14 is not necessarily limited to circular shapes, and a rectangular shape or the like may also be used without any problems.

The buffer layer 15 is provided to alleviate lattice mismatch between the semiconductor substrate 14 and the layers that constitute the light emitting unit 7. Accordingly, provided the substrate quality and the epitaxial growth conditions are selected appropriately, the buffer layer 15 may not be necessary.

The material for the buffer layer 15 is preferably the same material as that of the epitaxial growth substrate. In other words, in the present embodiment, the buffer layer 15 preferably employs the same GaAs as the GaAs substrate 14. In order to reduce the transmission of defects, as the buffer layer 15, a multilayer film composed of different materials from the GaAs substrate 14 may be employed. The thickness of the buffer layer 15 is preferably 0.1 µm or greater, and is more preferably 0.2 µm or greater.

The contact layer 16 is provided for the purpose of reducing the contact resistance with the electrodes. The material of the contact layer 16 preferably has a larger band gap than that of the strained light emitting layer 12, and is preferably a material having a composition represented by $Al_xGa_{1-x}As$ or $(Al_xGa_{1-x})_yIn_{1-y}P$ (wherein $0 \leq X \leq 1$ and $0 < Y \leq 1$).

Further, in order to reduce the contact resistance with the electrodes, the lower limit for the carrier concentration within the contact layer 16 is preferably $5 \times 10^{17}$ cm$^{-3}$ or greater, and is more preferably $1 \times 10^{18}$ cm$^{-3}$ or greater.

The upper limit for the carrier concentration is preferably not more than $2 \times 10^{19}$ cm$^{-3}$, at which point the crystallinity tends to deteriorate. The thickness of the contact layer 16 is preferably 0.5 µm or greater, and is most preferably 1 µm or greater. Although there are no particular limitations on the upper limit for the thickness of the contact layer 16, in order to ensure that the costs associated with the epitaxial growth fall within an appropriate range, the thickness is preferably not more than 5 µm.

In the present embodiment, conventional growth methods such as molecular beam epitaxy (MBE) and reduced-pressure metalorganic chemical vapor deposition (MOCVD) may be employed. Of these, the use of the MOCVD method, which offers superior applicability to mass production, is particularly desirable.

Specifically, the GaAs substrate 14 used for epitaxial growth of the compound semiconductor layer 2 is preferably subjected to preliminary treatments such as washing and heating treatments prior to the growing process in order to remove contaminants and any natural oxide film from the substrate surface.

The layers that constitute the compound semiconductor layer 2 can be produced by simultaneous epitaxial growth on 8 or more GaAs substrates 14 of diameter 50 to 150 mm positioned inside a MOCVD apparatus. Commercially available large-scale apparatus such as self-rotating or high-speed rotating apparatus can be used as the MOCVD apparatus.

During epitaxial growth of each of the layers of the compound semiconductor layer 2, compounds such as trimethylaluminum ($(CH_3)_3Al$), trimethylgallium ($(CH_3)_3Ga$) and trimethylindium ($(CH_3)_3In$) can be used as the raw materials for the group III elements. Further, bis(cyclopentadienyl)magnesium (bis-$(C_5H_5)_2Mg$) or the like can be used as a Mg doping raw material.

Furthermore, disilane ($Si_2H_6$) or the like can be used as a Si doping raw material. Moreover, phosphine ($PH_3$) and arsine ($AsH_3$) and the like may be used as raw materials for the group V elements.

In terms of the growing temperature used for each of the layers, in those cases where a p-type GaP is used as the strain adjustment layer 8, growth of the strain adjustment layer 8 is typically performed at a temperature within a range from 720 to 770° C., whereas the other layers are typically grown at 600 to 700° C. Moreover, the carrier concentration, thickness and temperature conditions and the like for each layer may be selected as appropriate.

The compound semiconductor layer 2 produced in this manner has a favorable surface state with minimal crystal defects, despite including the strained light emitting layer 7. Further, depending on the diode structure, the compound semiconductor layer 2 may be subjected to surface processing such as polishing or the like.

(Functional Substrate Bonding Step)

Next, the compound semiconductor layer 2 and the functional substrate 3 are bonded together. When bonding the compound semiconductor layer 2 and the functional substrate 3, first, the surface of the strain adjustment layer 8 of the compound semiconductor layer 2 is polished to a mirror finish.

Next, the functional substrate 3 that is to be bonded to the mirror-polished surface of the strain adjustment layer 8 is prepared. The surface of the functional substrate 3 is polished to a mirror finish prior to bonding to the strain adjustment layer 8.

Subsequently, the compound semiconductor layer 2 and the functional substrate 3 are installed in a typical semiconductor material bonding apparatus, and the two mirror-polished surfaces are irradiated under vacuum conditions with an Ar beam neutralized by bombardment with electrons. Subsequently, with the vacuum conditions maintained inside the bonding apparatus, the two surfaces are brought together and a load is applied, thus enabling bonding to be performed at room temperature (see FIG. 7).

(First and Second Electrode Formation Step)

Next, the n-type ohmic electrode 4 that acts as the first electrode and the p-type ohmic electrode 5 that acts as the second electrode are formed. When forming the n-type ohmic electrode 4 and the p-type ohmic electrode 5, first, an ammonia-based etchant is used to selectively remove the GaAs substrate 14 and the buffer layer 15 from the compound semiconductor layer 2 that is bonded to the functional substrate 3.

Subsequently, the n-type ohmic electrode 4 is formed on the surface of the exposed contact layer 16. Specifically, for example, a vacuum deposition method is used to deposit a certain thickness of AuGe or Ni alloy/Pt/Au, and a typical photolithography method and etching method are then used to pattern the deposited layer to form the shape of the n-type ohmic electrode 4.

Subsequently, portions of the contact layer 16, the upper cladding layer 11, the light emitting layer 10 and the lower cladding layer 9 are selectively removed to expose the strain adjustment layer 8, and the p-type ohmic electrode 5 is formed on this exposed surface of the strain adjustment layer 8.

Specifically, for example, a vacuum deposition method is used to deposit a certain thickness of AuBe/Au, and a typical photolithography method is then used to pattern the deposited layer to form the shape of the p-type ohmic electrode 5.

By subsequently performing alloying, by conducting a heat treatment under conditions including a temperature of 400 to 500° C. for a period of 5 to 20 minutes, the low-resistance n-type ohmic electrode 4 and p-type ohmic electrode 5 can be formed.

(Third Electrode Formation Step)

Next, the third electrode 6 is formed on the opposite surface of the functional substrate 3 to the surface that is bonded to the compound semiconductor layer 2. In those cases where a silver paste is used as the third electrode 6, the silver paste is applied to the surface of the functional substrate.

Further, in those cases where a light emitting layer is used as the third electrode, a sputtering method may be used to deposit, on the surface of the functional substrate 3, an ITO film (thickness: 0.1 μm) that functions as a transparent conductive film, and a silver alloy film (thickness: 0.1 μm) that forms a reflective layer.

Subsequently, for example, a film of tungsten (thickness: 0.1 μm) is deposited on this reflective layer as a barrier layer. Next, an Au film (thickness: 0.5 μm), a 1 μm film of AuSn (eutectic, melting point: 283° C.) and a 0.1 μm film of Au are then deposited sequentially on the barrier layer to form a connection layer.

A typical photolithography method may then be used to perform patterning into an arbitrary shape, thus forming the third electrode 6. The functional substrate 3 and the third electrode 6 represent a Schottky contact having minimal light absorption.

(Functional Substrate Processing Step)

Next, the shape of the functional substrate 3 is processed. When processing the functional substrate 3, first, V-shaped slots are formed in the surface of the functional substrate 3 in locations where the third electrode 6 does not exist. Within the inside surface of the V-shaped slot, a part thereof which exists near the third electrode 6 becomes the inclined surface 3$b$ that forms an angle α relative to a surface parallel to the light emission surface. Subsequently, dicing is performed at predetermined intervals from the side of the compound semiconductor layer 2, thus forming chips. The dicing performed during this chipping step forms the vertical surfaces 3$a$ of the functional substrate 3.

There are no particular limitations on the method used for forming the inclined surfaces 3$b$, and conventional methods such as wet etching, dry etching, scribing or laser processing may be combined as appropriate, although the use of a dicing method, which offers high levels of shape controllability and productivity, is the most desirable. By employing a dicing method, the production yield can be increased.

Further, although there are no particular limitations on the method used for forming the vertical surfaces 3$a$, a scribe-break method or a dicing method is preferred.

Adopting a scribe-break method enables the production costs to be reduced. In other words, a hem portion for cutting need not be provided during chip separation, meaning larger numbers of light emitting diodes can be produced, thus reducing production costs. On the other hand, a dicing method improves the light extraction efficiency from the vertical surfaces 3$a$, meaning a higher level of brightness can be achieved.

Finally, if necessary, any fractured layers or soiling caused by the dicing may be removed by etching with a mixed liquid of sulfuric acid and hydrogen peroxide or the like. This completes the production of the light emitting diode 1.

<Method of Producing Light Emitting Diode Lamp>

Next is a description of a method of producing a light emitting diode lamp 41 using the light emitting diode 1 described above, namely, a method of mounting the light emitting diode 1.

As illustrated in FIG. 1 and FIG. 2, a predetermined number of the light emitting diodes 1 are mounted on the surface of the mounting substrate 42. When mounting the light emitting diode 1, the mounting substrate 42 and the light emitting diode 1 are first positioned relative to each other, and the light emitting diode 1 is placed in a predetermined position on the mounting substrate 42.

Subsequently, a connection layer 15 of the third electrode 6 and the n-electrode terminal 43 provided on the surface of the mounting substrate 42 are subjected to eutectic metal bonding (eutectic metal die bonding).

This secures the light emitting diode 1 to the surface of the mounting substrate 42. The n-type ohmic electrode 4 of the light emitting diode 1 and the n-electrode terminal 43 of the mounting substrate 42 are then connected using the gold wire 45 (wire bonding connection).

Next, the p-type ohmic electrode 5 of the light emitting diode 1 and the p-electrode terminal 44 of the mounting substrate 42 are connected using the gold wire 46.

Finally, the surface of the mounting substrate 42 on which the light emitting diode 1 is mounted is sealed with a typical epoxy resin 47. This completes production of a light emitting diode lamp 41 using the light emitting diode 1.

A description is provided below of the case in which a voltage is applied across the n-electrode terminal 43 and the p-electrode terminal 44 in the light emitting diode lamp 41 having the structure described above.

First is a description of the case where a forward voltage is applied to the light emitting diode lamp 41.

When voltage is applied in the forward direction, a forward current first flows from the p-electrode terminal 44 connected to the anode, through the gold wire 46, and into the p-type ohmic electrode 5. The current then flows sequentially from the p-type ohmic electrode 5 into the strain adjustment layer 8, the lower cladding layer 9, the light emitting layer 10, the upper cladding layer 11, and the n-type ohmic electrode 4.

Subsequently, the current flows from the n-type ohmic electrode 4, through the gold wire 45, and into the n-electrode terminal 43 connected to the cathode. Because the light emitting diode 1 is provided with a high-resistance layer, the forward current does not flow from the strain adjustment layer 8 into the functional substrate 3 formed from n-type GaP.

When the forward current flows in the manner described above, light is emitted from the light emitting layer 10. Further, the light emitted from the light emitting layer 10 is emitted through the main light extraction surface. On the other hand, light emitted from the light emitting layer 10 toward the functional substrate 3 is reflected due to the shape of the functional substrate 3 and the existence of the third electrode 6, and is therefore also emitted through the main light extraction surface.

Accordingly, an increased level of brightness can be achieved for the light emitting diode lamp 41 (the light emitting diode 1) (see FIG. 2 and FIG. 4).

Further, because of the adjustment to the composition of the strained light emitting layer 12 that constitutes the light emitting layer 10, the emission spectrum of the light emitting diode lamp 41 has a peak emission wavelength within a range from 655 to 675 nm.

Furthermore, because fluctuation in the strained light emitting layer 12 within the light emitting layer 10 is suppressed by the strain adjustment layer 8, the full width at half maximum of the emission spectrum is within a range from 10 to 40 nm. Moreover, the emission intensity at an emission wavelength of 700 nm is less than 10% of the emission intensity at the peak emission wavelength.

Accordingly, the light emitting diode lamp 41 prepared using the light emitting diode 1 can be used favorably as the illumination used for promoting photosynthesis during plant growth.

As described above, in the light emitting diode 1 of the present embodiment, by forming the light emitting layer 10 from n (>1) strained light emitting layers 12 and (n−1) barrier layers 13 so that one strained light emitting layer and one barrier layer are laminated in an alternating arrangement, setting n to a value of 1 to 7, and ensuring that the thickness of the light emitting layer 10 is not more than 250 nm, the number of laminated layers of the strained light emitting layer 12 and the barrier layer 13 can be reduced, and the thickness of the light emitting layer 10 composed of the strained light emitting layer 12 and the barrier layer 13 can be reduced, thus enabling production of a light emitting diode 1 having a response time of 35 nm or less (namely, a light emitting diode having a rapid response time).

This type of light emitting diode 1 having a rapid response time can be used as a light emitting diode for plant growth, or as a light emitting diode for a high speed coupler used in electrical signal transmission within a high voltage circuit or the like.

Furthermore, by including the strained light emitting layer 12 having a composition formula of $(Al_XGa_{1-X})_YIn_{1-Y}P$ (wherein $0 \le X \le 0.1$ and $0.37 \le Y \le 0.46$), a light emitting diode 1 having an emission wavelength of 655 nm or greater can be produced.

Furthermore, in the light emitting diode 1 of the present embodiment, the strain adjustment layer 8 is provided on the light emitting unit 7. This strain adjustment layer 8 is transparent to the emission wavelength, and therefore a high-output, high-efficiency light emitting diode 1 can be produced that does not absorb the light emitted from the light emitting unit 7.

Moreover, because this strain adjustment layer 8 has a smaller lattice constant than the lattice constant of the GaAs substrate 14, warping of the compound semiconductor layer 2 can be suppressed. As a result, fluctuation in the amount of strain in the strained light emitting layer 12 within the light emitting layer 10 is reduced, enabling the production of a light emitting diode 1 having excellent monochromaticity.

Accordingly, the present embodiment is able to provide a light emitting diode 1 which has an emission wavelength of not less than 655 nm, exhibits excellent monochromaticity, displays high output and high efficiency, and has a rapid response time (specifically, 35 ns or less).

Further, the present embodiment is also able to provide a high-output light emitting diode 1 that has a light emission efficiency approximately 4 times or more that of conventional AlGaAs-based light emitting diodes.

Furthermore, the light emitting diode lamp 41 of the present embodiment includes the light emitting diode 1 that has an emission wavelength of not less than 655 nm, exhibits excellent monochromaticity, displays high output and high efficiency, and has a rapid response time. As a result, a light emitting diode lamp 41 can be provided that is ideal for illumination for plant growth.

<Light Emitting Diode(Second Embodiment)>

Figure 8:
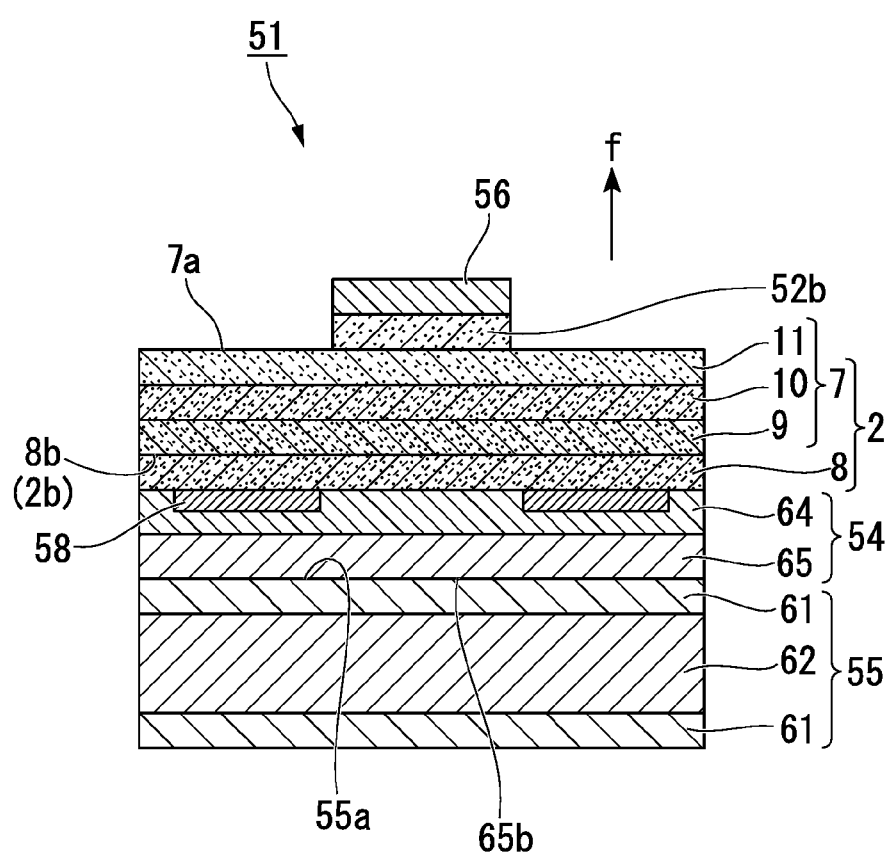
FIG. 8 is a cross-sectional view illustrating one example of a light emitting diode according to a second embodiment of the present invention.

FIG. 8 is a schematic cross-sectional view of a light emitting diode according to a second embodiment.

A light emitting diode 51 of this embodiment has a structure in which the compound semiconductor layer 2, which includes at least the light emitting unit 7 containing the light emitting layer 10 and the strain adjustment layer 8, and a functional substrate 55 are bonded together via a reflective structure 54. Further, a first electrode 56 is provided on a surface 7a of the light emitting unit 7 on the opposite side to the reflective structure 54, with a contact layer 52b disposed therebetween. A second electrode 58 is provided on a surface 8b of the strain adjustment layer 8 that faces the reflective structure 54.

The structure of the compound semiconductor layer 2 may be the same as the structure employed in the light emitting diode according to the first embodiment described above.

A more detailed description of those structures that differ from the light emitting diode according to the first embodiment is presented below.

<First Electrode, Second Electrode>

The first electrode 56 and the second electrode 58 are both ohmic electrodes, and there are no particular limitations on the shapes or positions of these electrodes, provided that the current can be diffused uniformly within the light emitting unit 7.

For example, electrodes that have a circular shape or rectangular shape when viewed in plan view can be used, and each electrode may be positioned at a single location, or a plurality of electrodes may be arranged in a grid-like pattern.

As materials that can be used for the first electrode 56, an AuGe layer, AuSi layer or the like can be used in those cases where an n-type compound semiconductor is used as the contact layer 52b. An AuBe layer, AuZn layer or the like can be used in those cases where a p-type compound semiconductor is used as the contact layer 52b.

Further, by laminating an Au layer or the like on top of the first electrode 56, oxidation can be prevented, and the reliability of the wire bonding connection can be improved.

As materials that can be used for the second electrode 58, an AuGe layer, AuSi layer or the like can be used in those cases where an n-type compound semiconductor is used as the strain adjustment layer 8. Further, in those cases where a p-type compound semiconductor is used as the strain adjustment layer 8, an AuBe layer, AuZn layer or the like can be used as the material for the second electrode 58.

<Reflective Structure>

As illustrated in FIG. 8, the reflective structure 54 is formed on the surface 7b of the light emitting unit 7 that faces the reflective structure 54 so as to cover the second electrode 58. The reflective structure 54 is produced by sequentially laminating a transparent conductive film 64 and a reflective layer 65.

The transparent conductive film 64 is formed on the surface 8b of the strain adjustment layer 8 (namely, the surface of the strain adjustment layer 8 on which the second electrode 58 is formed) so as to cover the second electrode 58. Examples of materials that can be used as the transparent conductive film 64 include an ITO film and an IZO film.

Further, a so-called cold mirror that utilizes the difference in refractive index between transparent materials, such as a multilayer film of titanium oxide and silicon oxide, or white alumina or AlN, may be used instead of the transparent conductive film 64, or together with the transparent conductive film 64, in combination with the reflective layer 65.

As illustrated in FIG. 8, the reflective layer 65 is laminated on the transparent conductive film 64. The reflective layer 65 is formed from a material such as a metal like copper, silver, gold or aluminum, or an alloy of these metals. These materials exhibit a high degree of optical reflectance, enabling the reflectance from the reflective structure 54 to be set to 90% or higher.

By providing this type of reflective layer 65, light from the light emitting layer 10 is reflected off by the reflective layer 65 in the front direction f, meaning the light extraction efficiency in the front direction f can be improved. As a result, the brightness of the light emitting diode 51 can be increased.

In this description, the front direction f represents the direction that forms an angle of 90° with the light extraction surface 2a of the compound semiconductor layer 2 (in this embodiment, the surface 7a of the light emitting unit 7), and represents the direction moving away from the light emitting diode 51. The reflective structure 54 may exclude the transparent conductive film 64, and be composed of only the reflective layer 65.

A specific example of the reflective layer 65 is a laminated film composed of Ag alloy layer/W layer/Pt layer/Au layer/connection metal layer, in which they are laminated in this order and the Ag alloy layer is provided on the side of the transparent conductive film 64. The connection metal layer formed as a surface 65b of the reflective layer 65 positioned opposite the surface that contacts the transparent conductive film 64, may use a metal having low electrical resistance and a low melting point. By using this type of connection metal, the functional substrate 55 can be connected without imparting heat stress to the light emitting unit 7.

For the aforementioned connection metal, the use of an Au-based eutectic metal or the like, which is chemically stable and has a low melting point, is preferred. Specific examples of this type of Au-based eutectic metal include eutectic compositions of alloys such as AuSn, AuGe and AuSi (namely, Au-based eutectic metals).

Further, it is desirable that a metal such as titanium, chromium or tungsten is added to the connection metal. Because these metals function as barrier metals, adding a metal such as titanium, chromium or tungsten to the connection metal can inhibit the diffusion and subsequent reaction of impurities or the like from the functional substrate 55 to the reflective layer 65 side of the structure.

<Functional Substrate (Metal Substrate)>

As illustrated in FIG. 8, the functional substrate 55 is affixed to a surface 2b of the compound semiconductor layer 2 (specifically, the surface 8b of the strain adjustment layer 8) via the reflective structure 54 disposed therebetween. Specifically, a bonding surface 55a of the functional substrate 55 is bonded to a surface 65b of the reflective structure 54 positioned on the opposite side to the surface of the reflective structure 54 that faces the light emitting unit 7.

In the second embodiment, a metal substrate is used as the functional substrate 55. In other words, in the second embodiment, a metal substrate is affixed to the surface 2b of the compound semiconductor layer 2 (specifically, the surface 8b of the strain adjustment layer 8) with the reflective structure 54 disposed therebetween. An example in which a metal substrate is used as the functional substrate 55 is described below.

As the functional substrate 55, a substrate formed from a plurality of metal layers can be used. Further, the functional substrate 55 preferably has a structure in which two different types of metal layer are laminated in an alternating arrangement. Further, the total number of layers of the two types of metal layer is preferably an odd number.

From the viewpoint of inhibiting warping and cracking of the functional substrate 55, in those cases where a material having a smaller coefficient of thermal expansion than the compound semiconductor layer 2 is used as a second metal layer 62, a first metal layer 61 is preferably formed from a material having a larger coefficient of thermal expansion than the compound semiconductor layer 2.

This ensures that the overall coefficient of thermal expansion for the entire functional substrate 55 is similar to the coefficient of thermal expansion of the compound semiconductor layer 2, and can therefore inhibit warping or cracking of the functional substrate 55 when the compound semiconductor layer 2 and the functional substrate 55 are bonded together, thereby increasing the yield of the light emitting diode 51.

Furthermore, when a material having a larger coefficient of thermal expansion than the compound semiconductor layer 2 is used as a second metal layer 62, the first metal layer 61 is preferably formed from a material having a smaller coefficient of thermal expansion than the compound semiconductor layer 2.

This ensures that the overall coefficient of thermal expansion for the entire functional substrate 55 is similar to the coefficient of thermal expansion of the compound semiconductor layer 2, and can therefore inhibit warping or cracking of the functional substrate 55 when the compound semiconductor layer 2 and the functional substrate 55 are bonded together, thereby increasing the yield of the light emitting diode 51.

As described above, the positions of the first and second metal layers 61 and 62 that constitute the functional substrate 55 may be switched. In other words, in FIG. 8, the structure of the functional substrate 55 contains a single second metal layer 62 sandwiched between two first metal layers 61, but a functional substrate 55 (metal substrate) in which a single first metal layer 61 is sandwiched between two second metal layers 62 may also be used.

The functional substrate 55 composed of the first and second metal layers 61 and 62 may have a structure composed of a combination of a metal layer formed from a material selected from among silver (coefficient of thermal expansion=18.9 ppm/K), copper (coefficient of thermal expansion=16.5 ppm/K), gold (coefficient of thermal expansion=14.2 ppm/K), aluminum (coefficient of thermal expansion=23.1 ppm/K), nickel (coefficient of thermal expansion=13.4 ppm/K) and alloys of these metals, and a metal layer formed from a material selected from among molybdenum (coefficient of thermal expansion=5.1 ppm/K), tungsten (coefficient of thermal expansion=4.3 ppm/K), chromium (coefficient of thermal expansion=4.9 ppm/K) and alloys of these metals.

An example of a preferred form of the functional substrate 55 (metal substrate) is a metal substrate having a three-layer structure composed of Cu layer/Mo layer/Cu layer. As described above, a metal substrate having a three-layer structure composed of Mo layer/Cu layer/Mo layer yields a similar effect to a metal substrate having a three-layer structure composed of Cu layer/Mo layer/Cu layer.

On the other hand, because a metal substrate having a three-layer structure composed of Cu layer/Mo layer/Cu layer has a structure in which the Mo, which has a high degree of mechanical strength, is sandwiched between the readily worked Cu, this particular structure offers the advantage of providing easier processing such as cutting of the metal substrate than the metal substrate having a three-layer structure composed of Mo layer/Cu layer/Mo layer.

The overall coefficient of thermal expansion for the entire functional substrate 55, for example in the case where a metal substrate composed of Cu layer (30 nm)/Mo layer (25 nm)/Cu layer (30 nm) is used as the functional substrate 55, is 6.1 ppm/K. Further, in the case where a metal substrate composed of Mo layer (25 μm)/Cu layer (70 μm)/Mo layer (25 μm) is used as the functional substrate 55, the overall coefficient of thermal expansion for the entire functional substrate 55 is 5.7 ppm/K.

Further, from the viewpoint of heat dissipation, the metal layers that constitute the functional substrate 55 are preferably composed of materials having a high degree of thermal conductivity. By using such materials, the heat dissipation properties of the functional substrate 55 can be improved, meaning that not only can the light emitting diode 51 emit at a high brightness level, but the lifespan of the light emitting diode 51 can be extended.

Examples of materials that can be used favorably as the material having a high degree of thermal conductivity include silver (thermal conductivity=420 W/m·K), copper (thermal conductivity=398 W/m·K), gold (thermal conductivity=320 W/m·K), aluminum (thermal conductivity=236 W/m·K), molybdenum (thermal conductivity=138 W/m·K), tungsten (thermal conductivity=174 W/m·K), and alloys of these metals.

Moreover, it is preferable that the coefficient of thermal expansion of the metal layers that constitute the functional substrate 55 is approximately equal to the coefficient of thermal expansion of the compound semiconductor layer 2.

It is particularly desirable that the coefficient of thermal expansion of the materials of the metal layers that constitute the functional substrate 55 is within ±1.5 ppm/K of the coefficient of thermal expansion of the compound semiconductor layer 2. This enables the stress that is generated within the light emitting unit 7 when the functional substrate 55 and the compound semiconductor layer 2 are bonded together (namely, stress caused by heat) to be minimized, and therefore cracking of the functional substrate 55 caused by the heat generated when the functional substrate 55 and the compound semiconductor layer 2 are bonded can be inhibited, thus enabling the yield of the light emitting diode 51 to be increased.

When a metal substrate composed of Cu layer (30 μm)/Mo layer (25 μm)/Cu layer (30 μm) is used as the functional substrate 55, the thermal conductivity of the functional substrate 55 is 250 W/m·K.

Further, when a metal substrate composed of Mo layer (25 μm)/Cu layer (70 μm)/Mo layer (25 μm) is used as the functional substrate 55, the thermal conductivity of the functional substrate 55 is 220 W/m·K.

The thickness of the functional substrate 55 composed of the metal substrate is preferably not less than 50 μm and not more than 150 μm.

If the thickness of the functional substrate 55 exceeds 150 μm, the production cost of the light emitting diode tends to increase undesirably. In contrast, if the thickness of the functional substrate 55 is thinner than 50 μm, then cracking, chipping and warping and the like tend to occur more easily during handling, which can result in a reduction in the yield of the light emitting diode.

The number of layers of the first metal layer 61 and second metal layer 62 that constitute a single functional substrate 55 is preferably a total of 3 to 9 layers, and more preferably 3 to 5 layers.

If the number of layers of the first metal layer 61 and second metal layer 62 totals only two layers, then the thermal expansion in the thickness direction tends to become unbalanced, increasing the chance of cracking of the functional substrate 55. In contrast, if the number of layers of the first metal layer 61 and second metal layer 62 totals more than 9 layers, the thickness of each individual first metal layer 61 and second metal layer 62 must be reduced considerably.

However, reducing the thickness of the first metal layer 61 and the second metal layer 62 is extremely difficult, and when the thickness of the first metal layer 61 or the second metal layer 62 is reduced, the thickness of each individual layer tends to lack uniformity, which can cause fluctuations in the properties of the light emitting diode.

Moreover, a metal substrate in which the thickness of each individual layer has been reduced is more prone to cracking of the substrate.

Furthermore, when a metal substrate is used in which the thickness of each individual layer has been reduced, because production of the metal substrate is problematic, the production costs of the light emitting diode tend to increase.

A bonding assistant film that stabilizes the electrical contact, or a eutectic metal for die bonding may be formed on the bonding surface 55a of the functional substrate 55. This enables the bonding step to be performed more easily. An Au film or an AuSn film or the like can be used as the bonding assistant film.

The method used for bonding the functional substrate 55 to the light emitting unit 7 is not limited to the method described above, and for example, other conventional techniques such as diffusion bonding, bonding using an adhesive, or normal temperature bonding may be employed.

In the light emitting diode 51 of the second embodiment, by including the pn junction-type light emitting unit 7 having the light emitting layer 10 composed of n (>1) strained light emitting layers and (n−1) barrier layers, forming the light emitting layer 10 with a structure in which one strained light emitting layer and one barrier layer are laminated in an alternating arrangement, setting n to a value of 1 to 7, ensuring that the thickness of the light emitting layer 10 is not more than 250 nm, and ensuring that the strained light emitting layer satisfies a composition formula of $(Al_XGa_{1-X})_YIn_{1-Y}P$ (wherein $0 \le X \le 0.1$ and $0.37 \le Y \le 0.46$), the emission efficiency of the light emitted from the light emitting unit 7 and the response time can be improved.

Further, by limiting a composition for the strained light emitting layer 12 in the above range, a light emitting diode 51 having an emission wavelength of 655 nm or greater can be produced.

Furthermore, by providing the strain adjustment layer 8, which transmits the light from the light emitting unit 7, on top of the light emitting unit 7, light from the light emitting unit 7 is not absorbed by the strain adjustment layer 8, and therefore a high-output, high-efficiency light emitting diode 51 can be produced.

Moreover, because this strain adjustment layer 8 has a smaller lattice constant than the lattice constants of the strained light emitting layer 12 and the barrier layer 13, warping of the compound semiconductor layer 2 can be suppressed. As a result, fluctuation in the amount of strain in the strained light emitting layer 12 is reduced, enabling the production of a light emitting diode 51 having excellent monochromaticity.

Further, because the reflective structure 54 is provided on the surface 2b of the compound semiconductor layer 2 positioned on the opposite side of the compound semiconductor layer 2 to the light extraction surface 2a, of the light that is emitted outside the light emitting diode 51 from the light extraction surface 2a of the compound semiconductor layer 2, the intensity of the light in a direction orthogonal to the light extraction surface 2a (specifically, the front direction f) can be increased, enabling production of a light emitting diode 51 having high brightness and high efficiency.

Furthermore, by increasing the intensity of light in a direction orthogonal to the light extraction surface 2a, the power consumption of a light emitting diode having the same light intensity in the direction orthogonal to the light extraction surface 2a as that of a light emitting diode not provided with the reflective structure 54 can be reduced compared with the power consumption of the light emitting diode not provided with the reflective structure.

Furthermore, by using a metal substrate as the functional substrate 55 that is bonded to the surface 2b of the compound semiconductor layer 2 with the reflective structure 54 disposed therebetween, the heat that is generated during light emission from the light emitting unit 7 can be efficiently dissipated through the functional substrate 55 and released outside the light emitting diode 51.

Moreover, by forming the functional substrate 55 from the first and second metal layers 61 and 62 having a thermal conductivity of at least 130 W/m·K, the heat dissipation properties of the functional substrate 55 can be improved, meaning that not only can the light emitting diode 51 emit at a high brightness level, but the lifespan of the light emitting diode 51 can be extended.

Further, in those cases where a substrate that transmits light is used as the functional substrate 55, and this substrate is bonded using an Ar beam, the bonded surface tends to develop high resistance, inhibiting the flow of current to the substrate side, but by using a metal substrate as the functional substrate 55 and bonding this metal substrate by eutectic bonding, preparation of a single wire structure is possible.

In other words, according to the light emitting diode of the second embodiment, a light emitting diode 51 can be provided which has a red emission wavelength of not less than 655 nm, exhibits excellent monochromaticity, displays high output and high efficiency, has a rapid response time, exhibits strong light intensity in a direction orthogonal to the light extraction surface, and also has excellent heat dissipation properties.

<Method of Producing Light Emitting Diode (of Second Embodiment)>

Next is a description of a method of producing the light emitting diode 51 of the second embodiment.

The method of producing the light emitting diode 51 of the second embodiment includes a step of forming the functional substrate 55, a step of forming the light emitting unit 7 containing the light emitting layer 10 on a semiconductor substrate 53 with the contact layer 52b disposed therebetween, and then forming the second electrode 58 on the surface of the light emitting unit 7 on the opposite side to the semiconductor substrate 53, a step of forming the reflective structure 54 on the surface of the light emitting unit 7 on the opposite side to the semiconductor substrate with the second electrode 58 disposed therebetween, a step of bonding the functional substrate 55 to the light emitting unit 7 with the reflective structure 54 disposed therebetween, a step of removing the semiconductor substrate 53 and a portion of the contact layer 52b, and a step of forming the first electrode 56 on the surface of the light emitting unit 7 on the opposite side to the functional substrate 55.

FIG. 9A to FIG. 15 are cross-sectional views illustrating the production steps for producing a light emitting diode according to the second embodiment of the present invention. In FIG. 9A to FIG. 15, structural components that are the same as those of the light emitting diode 51 illustrated in FIG. 8 are labeled using the same symbols.

The method of producing the light emitting diode 51 of the second embodiment is described below with reference to FIG. 9A to FIG. 15. First is a description of the production step for forming the functional substrate 55.

<Functional Substrate Production Step>

Figure 9A:
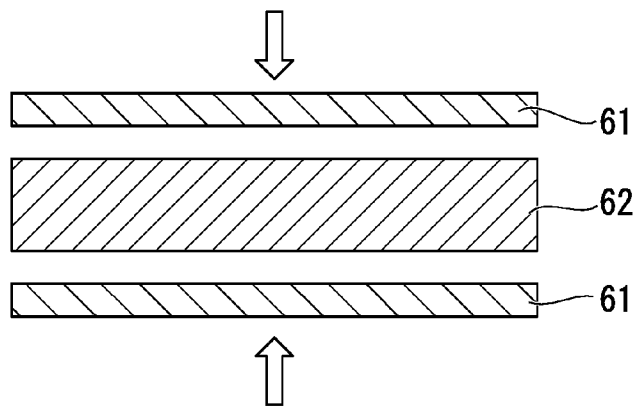
FIG. 9A is a cross-sectional view illustrating one of the production steps for the light emitting diode according to the second embodiment of the present invention, and illustrates a state in which first and second metal layers are positioned in an opposing relationship.
Figure 9B:
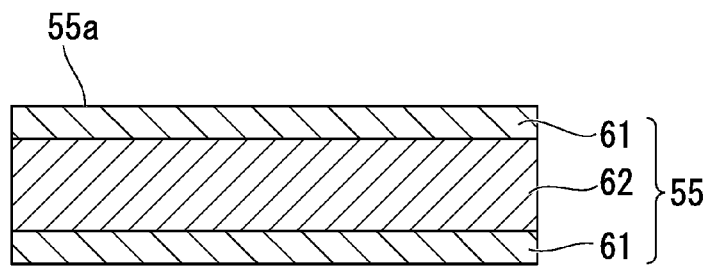
FIG. 9B is a cross-sectional view illustrating one of the production steps for the light emitting diode according to the second embodiment of the present invention, and illustrates a state in which contact bonding of the first and second metal layers are performed by applying pressure to form a functional substrate composed of the first and second metal layers.

As illustrated in FIG. 9A and FIG. 9B, the functional substrate 55 is formed by hot pressing the first and second metal layers 61 and 62 having a thermal conductivity of 130 W/m·K or more.

Specifically, two substantially flat first metal layers 61 and one substantially flat second metal layer 62 are first prepared.

For example, Cu layers having a thickness of 30 μm are used as the first metal layers 61, and a Mo layer having a thickness of 25 μm is used as the second metal layer 62.

Next, as illustrated in FIG. 9A, the second metal layer 62 is inserted between the two first metal layers 61 to form a laminated arrangement.

Subsequently, the laminated structure of the first and second metal layers 61 and 62 is placed inside a prescribed pressure device, and under high-temperature conditions, the first and second metal layers 61 and 62 are crimped by applying a load in the direction shown by the arrows (see FIG. 9A).

As illustrated in FIG. 9B, this results in the formation of a three-layer functional substrate 55 in which the first metal layers 61 are Cu layers and the second metal layer 62 is a Mo layer, with a composition represented by Cu layer (30 μm)/Mo layer (25 μm)/Cu layer (30 μm). The coefficient of thermal expansion of the functional substrate 55 having the above construction is 6.1 ppm/K, and the thermal conductivity is 250 W/m·K.

Subsequently, the substrate may be cut to a size that matches the bonding surface of the light emitting unit 7 (wafer), and the surface may be polished to a mirror finish.

Further, a bonding assistant film that stabilizes the electrical contact may be formed on the bonding surface 55a of the functional substrate 55. A gold film, platinum film or nickel film or the like can be used as the bonding assistant film. For example, a nickel film of 0.1 μm may first be formed, and a gold film of 0.5 μm then formed on the nickel film.

Moreover, a eutectic metal film for die bonding such as an AuSn film may be formed on the functional substrate 55 instead of the above bonding assistant film. This enables the bonding step to be performed more easily.

<Light Emitting Unit and Second Electrode Formation Step>

Figure 10:
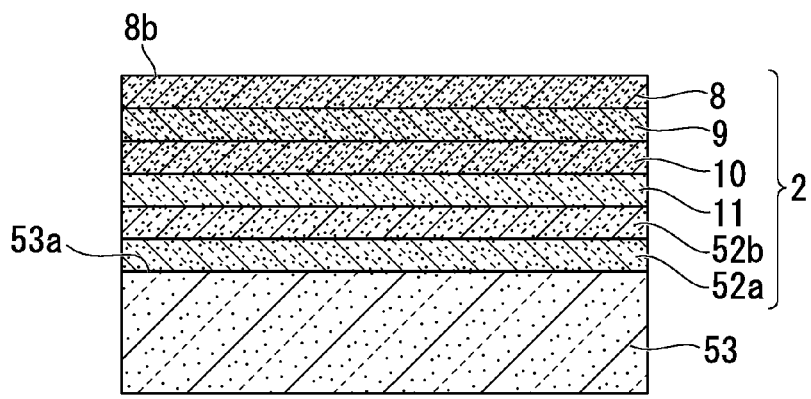
FIG. 10 is a cross-sectional view illustrating a production step for the light emitting diode according to the second embodiment of the present invention.

First, as illustrated in FIG. 10, a plurality of epitaxial layers are grown on the surface 53a of the semiconductor substrate 53 to form the compound semiconductor layer 2. At this stage, the contact layer 52b that constitutes part of the compound semiconductor layer 2 has not been patterned.

The semiconductor substrate 53 is the substrate used for forming the compound semiconductor layer 2, and for example, the substrate is typically a Si-doped n-type GaAs monocrystalline substrate in which the surface 53a is inclined 15° from the (100) plane. In this manner, when an AlGaInP layer or AlGaAs layer is used for the compound semiconductor layer 2, it is preferable to use a gallium arsenide (GaAs) monocrystalline substrate as the substrate for formation of the compound semiconductor layer 2.

The compound semiconductor layer 2 is produced by sequentially laminating, on top of the GaAs substrate that functions as the semiconductor substrate 53, a buffer layer 52a composed of GaAs, the contact layer 52b composed of Si-doped n-type AlGaInP, the n-type upper cladding layer 11, the light emitting layer 10, the p-type lower cladding layer 9, and the strain adjustment layer 8 composed of Mg-doped p-type GaP.

The above step of forming the compound semiconductor layer 2 on the GaAs substrate 53 can be performed in the same manner as the first embodiment.

Next, the surface 8b of the strain adjustment layer 8 on the opposite side to the semiconductor substrate 53 is subjected to mirror polishing down to a depth of 1 μm from the surface, and the surface roughness is reduced to not more than 0.18 nm.

Figure 11:
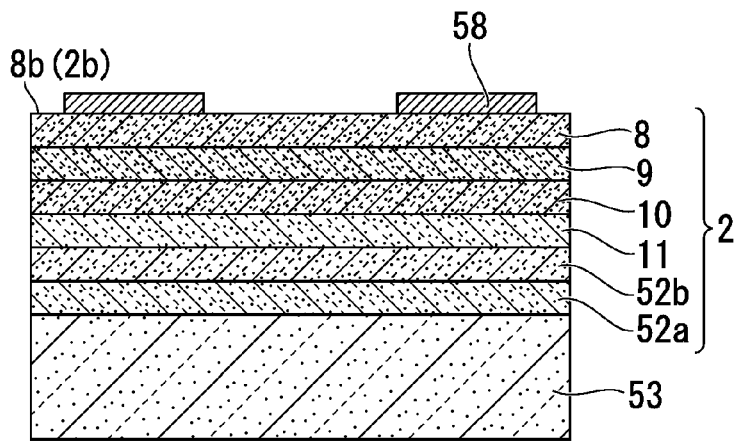
FIG. 11 is a cross-sectional view illustrating a production step for the light emitting diode according to the second embodiment of the present invention.

Subsequently, as illustrated in FIG. 11, the second electrode 58 (ohmic electrode) is formed on the surface 8b of the strain adjustment layer 8. The second electrode 58 can be produced, for example, by laminating an Au layer having a thickness of 0.2 μm on top of an AuBe layer having a thickness of 0.4 μm. When viewed in a plan view, the shape of the second electrode 58 is, for example, a circular shape of 20 μmø, and is formed with a 60 μm spacing between adjacent electrodes.

<Reflective Structure Formation Step>

Figure 12:
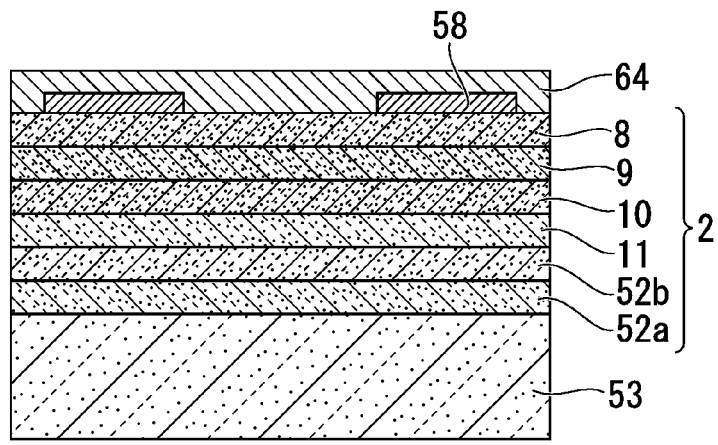
FIG. 12 is a cross-sectional view illustrating a production step for the light emitting diode according to the second embodiment of the present invention.

Next, as illustrated in FIG. 12, the transparent conductive film 64 composed of an ITO film is formed so as to cover the second electrode 58 and the surface 8b of the strain adjustment layer 8 on the opposite side to the semiconductor substrate 53. A heat treatment is then performed at 450° C., thus forming ohmic contact between the second electrode 58 and the transparent conductive film 64.

Figure 13:
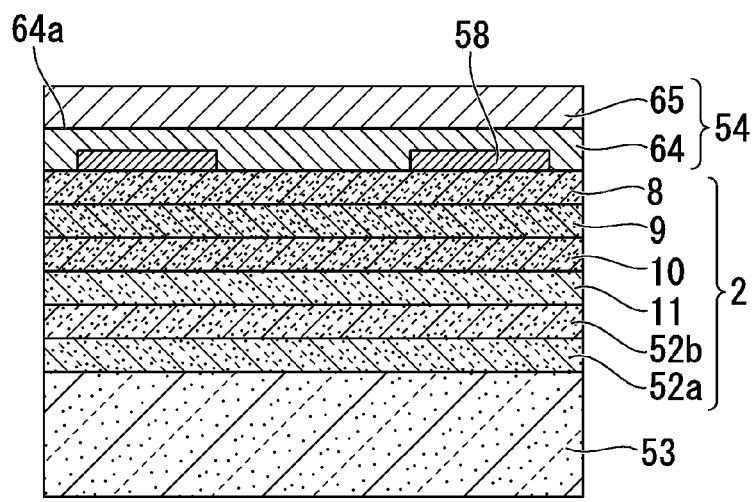
FIG. 13 is a cross-sectional view illustrating a production step for the light emitting diode according to the second embodiment of the present invention.

Subsequently, as illustrated in FIG. 13, a vapor deposition method is used to form the reflective layer 65 on a surface 64a of the transparent conductive film 64 on the opposite side to the compound semiconductor layer 2.

Specifically, the reflective layer 65 is formed by sequentially forming a film composed of a silver (Ag) alloy (having a thickness of 0.5 μm), a tungsten (W) film (having a thickness of 0.1 μm), a platinum (Pt) film (having a thickness of 0.1 μm), a gold (Au) film (having a thickness of 0.5 μm), and a film composed of an AuGe eutectic metal (melting point: 386° C., thickness: 1 μm). This completes formation of the reflective structure 54 composed of the reflective layer 65 and the transparent conductive film 64.

<Functional Substrate Bonding Step>

Figure 14:
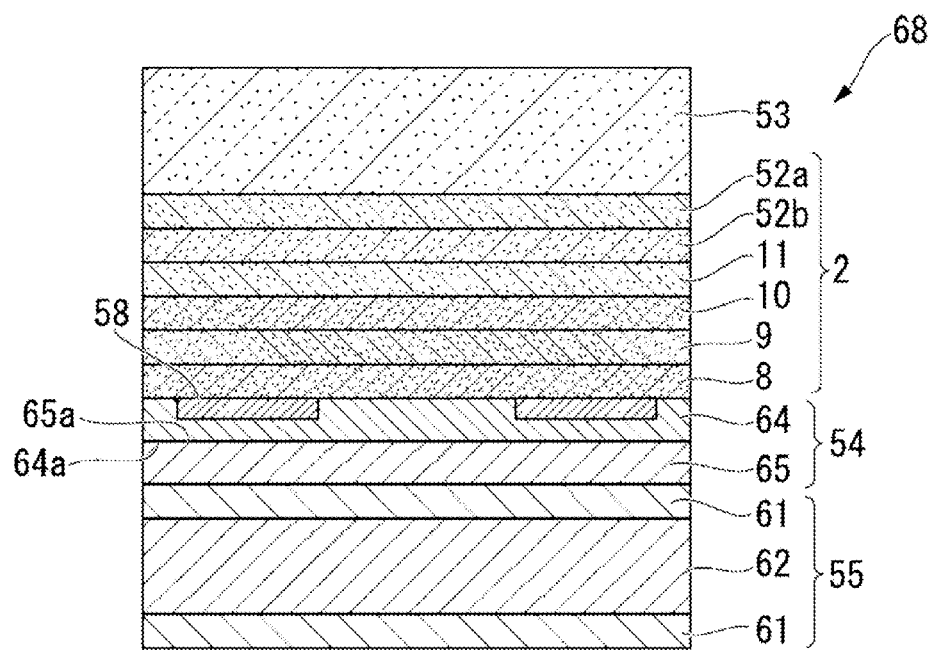
FIG. 14 is a cross-sectional view illustrating a production step for the light emitting diode according to the second embodiment of the present invention.

Next, as illustrated in FIG. 14, the semiconductor substrate 53 having the reflective structure 54 and the compound semiconductor layer 2 formed thereon (namely, the structure illustrated in FIG. 13), and the functional substrate 55 illustrated in FIG. 9B are transported into a reduced pressure apparatus (not shown in the figures) and positioned so that a bonding surface 54a of the reflective structure 54 faces the bonding surface 55a of the functional substrate 55.

The inside of the reduced pressure apparatus is then evacuated down to $3 \times 10^{-5}$ Pa, and with the semiconductor substrate 53 and the functional substrate 55 heated at 400° C., a load of 100g/cm² is applied to bond the bonding surface 54a of the reflective structure 54 to the bonding surface 55a of the functional substrate 55, thus forming a bonded structure 68.

<Semiconductor Substrate and Buffer Layer Removal Step>

Figure 15:
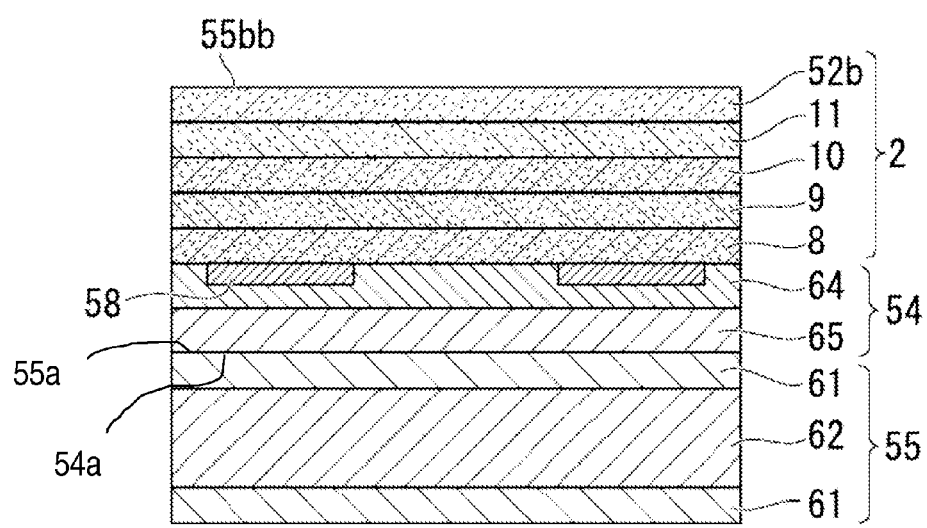
FIG. 15 is a cross-sectional view illustrating a production step for the light emitting diode according to the second embodiment of the present invention.

Subsequently, as illustrated in FIG. 15, the semiconductor substrate 53 and the buffer layer 52a are selectively removed from the bonded structure 68 using an ammonia-based etchant. This forms the light emitting unit 7 having the light emitting layer 10.

<First Electrode Formation Step>

Next, using a vacuum deposition method, an electrode-forming conductive film that functions as the base material for the first electrode 56 (n-type ohmic electrode) is formed on a surface 52bb of the contact layer 52b on the opposite side to the reflective structure 54. Examples of materials that can be used as the electrode-forming conductive film include a metal layered structure composed of AuGe layer/Ni layer/Au layer.

In this case, for example, the AuGe layer (Ge mass ratio: 12%) is first formed with a thickness of 0.15 μm, the Ni layer is then formed with a thickness of 0.05 μm, and the Au layer is then formed with a thickness of 1 μm.

Next, a typical photolithography method is used to pattern the electrode-forming conductive film into a circular shape when viewed in plan view, thus completing formation of the first electrode 56.

Subsequently, the contact layer 52b is also patterned so as to match the shape of the first electrode 56, thus producing the light emitting diode 51 illustrated in FIG. 8.

Following patterning of the electrode-forming conductive film, a heat treatment is preferably performed, for example by heating at 420° C. for 3 minutes, to effect alloying of the metals that constitute the first electrode 56. This enables a reduction in the resistance of the first electrode 56 that functions as the n-type ohmic electrode.

Subsequently, the light emitting unit 7 is removed by etching from cutting portions designed for partitioning the light emitting diode 51 into chips of a prescribed size, and a laser is then used to cut the substrate and the connection layer within the cutting portions with a pitch of 0.8 mm, thus forming light emitting diode chips (LED chips) of the prescribed size. The size of each light emitting diode chip, for example when viewed in plan view, has a substantially rectangular shaped light emitting unit 7 with a length across the diagonal of 1.1 mm.

Subsequently, the exposed surface of the light emitting unit 7 is protected with a pressure-sensitive adhesive sheet, and the cut surfaces are washed.

<Light Emitting Diode(Third Embodiment)>

Figure 16A:
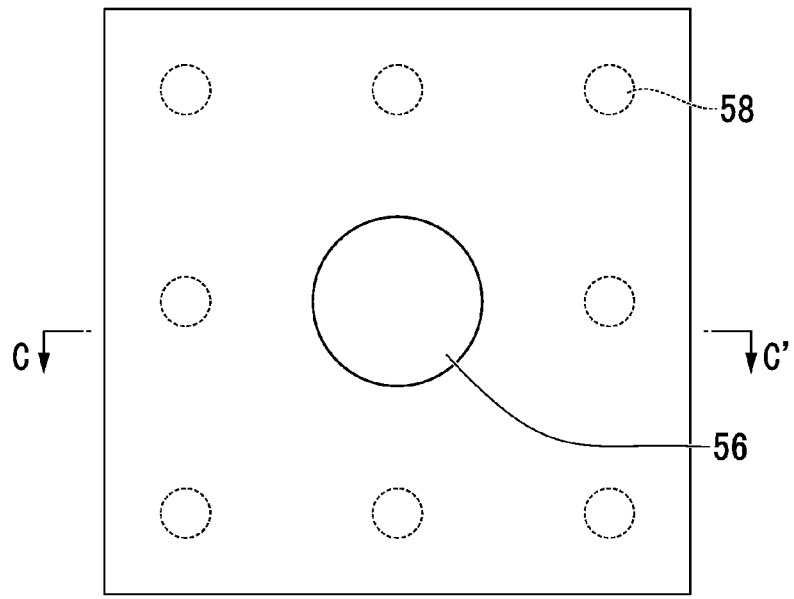
FIG. 16A is a cross-sectional view illustrating one example of a light emitting diode according to a third embodiment of the present invention, and is a plan view of the light emitting diode of the third embodiment.
Figure 16B:
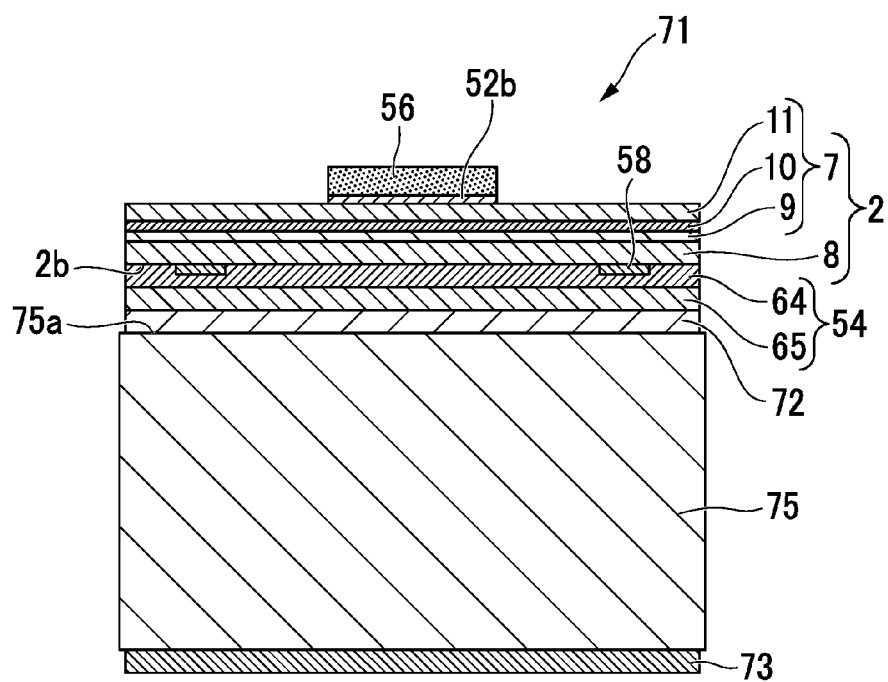
FIG. 16B is a schematic cross-sectional view of the light emitting diode illustrated in FIG. 16A along the line A-A' in FIG. 16A.

FIG. 16A and FIG. 16B are diagrams for describing a light emitting diode according to a third embodiment of the present invention. FIG. 16A is a plan view of a light emitting diode of the third embodiment, and FIG. 16B is a schematic cross-sectional view of the light emitting diode illustrated in FIG. 16A along the line A-A' in FIG. 16A.

As illustrated in FIG. 16A and FIG. 16B, with the exceptions of replacing the functional substrate 55 (metal substrate) provided in the light emitting diode 51 of the second embodiment with a functional substrate 75 formed from a different material from the functional substrate 55 (metal substrate), and providing metal layers 72 and 73, a light emitting diode 71 according to the third embodiment has the same structure as the light emitting diode 51 of the second embodiment.

In other words, the major point of difference between the light emitting diode 71 of the third embodiment and the light emitting diode 51 of the second embodiment is the fact that the material of the functional substrate differs.

The functional substrate 75 is bonded, via the metal layer 72, to the reflective structure 54 (specifically, the reflective layer 65) on which the compound semiconductor layer 2 is provided. Examples of materials that can be used as the material for the functional substrate 75 include any of GaP, Si and Ge.

In this manner, by providing the functional substrate 75 composed of a material selected from among GaP, Si and Ge, the heat that is generated during light emission from the light emitting unit 7 can be dissipated and released outside the light emitting diode 71 more efficiently than in a light emitting diode not provided with the functional substrate 75.

Further, by using a corrosion-resistant material such as Si or Ge as the material for the functional substrate 75, the moisture resistance of the functional substrate 75 can be improved.

The metal layer 72 is provided between the reflective layer 65 that constitutes part of the reflective structure 54 and an upper surface 75a of the functional substrate 75. The metal layer 72 is used for bonding the reflective layer 65 and the upper surface 75a of the functional substrate 75. A multilayer film prepared, for example, by sequentially laminating an In layer, an Au layer and a Ti layer can be used as the metal layer 72.

The metal layer 73 is provided on a lower surface 75b of the functional substrate 75. A multilayer film prepared, for example, by sequentially laminating an Au layer and a Ti layer can be used as the metal layer 73.

In the light emitting diode according to the third embodiment, by providing the functional substrate 75, which is bonded via the metal layer 72 to the reflective structure 54 on which the compound semiconductor layer 2 is provided, and which is formed from a material selected from among GaP, Si and Ge, the heat that is generated during light emission from the light emitting unit 7 can be dissipated and released outside the light emitting diode 71 more efficiently than in a light emitting diode not provided with the functional substrate 75.

Further, by using a corrosion-resistant material such as Si or Ge as the material used for forming the functional substrate 75, the moisture resistance of the functional substrate 75 can be improved.

Furthermore, because the reflective structure 54 is provided on the surface 2b of the compound semiconductor layer 2 positioned on the opposite side of the compound semiconductor layer 2 to the light extraction surface, of the light that is emitted outside the light emitting diode 71 from the light extraction surface of the compound semiconductor layer 2, the intensity of the light in a direction orthogonal to the light extraction surface (specifically, the front direction f) can be increased, enabling production of a light emitting diode 71 having high brightness and high efficiency.

Further, in the light emitting diode 71 of the third embodiment, by including the pn junction-type light emitting unit 7 having the light emitting layer 10 composed of n (≥1) strained light emitting layers 12 and (n−1) barrier layers 13, forming the light emitting layer 10 with a structure in which one strained light emitting layer and one barrier layer are laminated in an alternating arrangement, setting n to a value of 1 to 7, ensuring that the thickness of the light emitting layer 10 is not more than 250 nm, and ensuring that the strained light emitting layer satisfies a composition formula of $(Al_xGa_{1-x})yIn_{1-y}P$ (wherein $0 \leq X \leq 0.1$ and $0.37 \leq Y \leq 0.46$), the emission efficiency of the light emitted from the light emitting unit 7 and the response time can be improved.

Furthermore, by specifying a composition for the strained light emitting layer 12 that satisfies the above range, a light emitting diode 71 having an emission wavelength of 655 nm or greater can be produced.

Moreover, by providing the strain adjustment layer 8, which transmits the light from the light emitting unit 7, on top of the light emitting unit 7, light from the light emitting unit 7 is not absorbed by the strain adjustment layer 8, and therefore a high-output, high-efficiency light emitting diode 71 can be produced.

Further, because this strain adjustment layer 8 has a smaller lattice constant than the lattice constants of the strained light emitting layer 12 and the barrier layer 13, warping of the compound semiconductor layer 2 can be suppressed. As a result, fluctuation in the amount of strain in the strained light emitting layer 12 is reduced, enabling the production of a light emitting diode 71 having excellent monochromaticity.

EXAMPLES

The effects of the present invention are described below in further detail using a series of examples. However, the present invention is in no way limited by these examples.

In the examples, specific descriptions are provided of examples of producing light emitting diodes according to the present invention. The light emitting diodes produced in the examples are red light emitting diodes having an AlGaInP light emitting unit. In the examples, each light emitting diode was prepared by bonding together a compound semiconductor layer grown on top of a GaAs substrate, and a functional substrate composed of GaP. In order to evaluate the properties of each light emitting diode, a light emitting diode lamp having a light emitting diode chip mounted on a substrate was prepared.

Examples 1 to 11 are so-called transparent systems, and represent examples of the first embodiment that does not have a reflective structure.

Further, Examples 12 to 16 are so-called reflective systems having a reflective structure, wherein Examples 12 and 16 are examples of the second embodiment in which the functional substrate is a metal substrate, and Examples 13 to 15 are examples of the third embodiment, in which the functional substrate is formed from GaP, Ge and Si respectively.

Example 1

In a light emitting diode of Example 1, first, an epitaxial wafer was prepared by sequentially laminating compound semiconductor layers on top of a GaAs substrate (thickness: approximately 0.5 μm) composed of monocrystalline Si-doped n-type GaAs. In the GaAs substrate, the growth plane was inclined 15° from the (100) plane toward the (0-1-1) direction, and the carrier concentration was $2 \times 10^{18}$ cm$^{-3}$.

Further, an n-type buffer layer composed of Si-doped GaAs, an n-type contact layer composed of Si-doped $(Al_{0.7}Ga_{0.3})_{0.5}In_{0.5}P$, an n-type upper cladding layer composed of Si-doped $(Al_{0.7}Ga_{0.3})_{0.5}In_{0.5}P$, a strained light emitting layer/barrier layer composed of a pair of undoped $Ga_{0.42}In_{0.58}P/(Al_{0.53}Ga_{0.47})_{0.5}In_{0.5}P$, a p-type lower cladding layer composed of Mg-doped $(Al_{0.5}Ga_{0.3})_{0.5}In_{0.5}P$, a thin-film intermediate layer composed of $(Al_{0.5}Ga_{0.5})_{0.5}In_{0.5}P$, and a strain adjustment layer composed of Mg-doped p-type GaP were formed sequentially as the compound semiconductor layers on top of the GaAs substrate.

In Example 1, a reduced-pressure metalorganic chemical vapor deposition apparatus (MOCVD apparatus) was used, and an epitaxial wafer was formed by performing epitaxial growth of the compound semiconductor layers on a GaAs substrate having a diameter of 76 mm and a thickness of 350 μm.

During growth of the epitaxial growth layers, trimethylaluminum $((CH_3)_3Al)$, trimethylgallium $((CH_3)_3Ga)$ and trimethylindium $((CH_3)_3In)$ were used as the raw materials for the group III elements. Further, bis(cyclopentadienyl)magnesium $(bis-(C_5H_5)_2Mg)$ was used as the Mg doping material. Furthermore, disilane $(Si_2H_6)$ was used as the Si doping material.

Moreover, phosphine $(PH_3)$ and arsine $(AsH_3)$ were used as the raw materials for the group V elements. In terms of the growing temperature used for each of the layers, growth of the strain adjustment layer composed of p-type GaP was performed at 750° C., whereas each of the other layers was grown at 700° C.

The buffer layer composed of GaAs had a carrier concentration of approximately $2 \times 10^{18}$ cm$^{-3}$ and a thickness of approximately 0.5 μM. The contact layer had a carrier concentration of approximately $2 \times 10^{18}$ cm$^{-3}$ and a thickness of approximately 3.5 μm. The upper cladding layer had a carrier concentration of approximately $1 \times 10^{18}$ cm$^{-3}$ and a thickness of approximately 0.5 μm.

The strained light emitting layer was composed of a layer of undoped $Ga_{0.42}In_{0.58}P$ with a thickness of approximately 10 nm, and the number of barrier layers was set to zero. In other words, in Example 1, the light emitting layer mentioned above was composed of only a single strained light emitting layer. In this case, the thickness of the light emitting layer was 10 nm.

The lower cladding layer had a carrier concentration of approximately $8 \times 10^{17}$ cm$^{-3}$ and a thickness of approximately 0.5 μm. The intermediate layer had a carrier concentration of approximately $8 \times 10^{17}$ cm$^{-3}$ and a thickness of approximately 0.05 μm.

The strain adjustment layer composed of GaP had a carrier concentration of approximately $3 \times 10^{18}$ cm$^{-3}$ and a thickness of approximately 9 μm.

Next, the strain adjustment layer was polished down to a depth of approximately 1 μm from the surface, forming a mirror finish. This mirror finishing reduced the surface roughness of the strain adjustment layer to 0.18 nm.

Meanwhile, the functional substrate composed of n-type GaP was prepared for subsequent bonding to this mirror-polished surface of the strain adjustment layer. Si was added to this functional substrate for bonding in sufficient amount to yield a carrier concentration of approximately $2 \times 10^{17}$ cm$^{-3}$, and a monocrystalline substrate with a planar orientation of (111) was prepared.

The diameter of the functional substrate was 76 mm, and the thickness was 250 μm. Prior to bonding to the strain adjustment layer, the surface of this functional substrate was polished to a mirror finish with a root mean square (rms) value of 0.12 nm.

Next, the aforementioned functional substrate and the epitaxial wafer were installed in a typical semiconductor material bonding apparatus, and the inside of the apparatus was evacuated down to a vacuum of $3 \times 10^{-5}$ Pa.

Subsequently, the surfaces of both the functional substrate and the strain adjustment layer were irradiated for a period of 3 minutes with an Ar beam neutralized by bombardment with electrons. The vacuum conditions were then maintained inside the bonding apparatus, while the surfaces of the functional substrate and the strain adjustment layer were brought together. A load was applied that produced a pressure of 50 g/cm$^2$ at each of the surfaces, thus bonding the two surfaces together at room temperature. This completed the formation of a bonded wafer.

Next, the GaAs substrate and the GaAs buffer layer were selectively removed from the bonded wafer using an ammonia-based etchant. Subsequently, a vacuum deposition method was used to sequentially deposit, on the surface of the contact layer, an Au—Ge—Ni alloy film having a thickness of 0.5 μm, a Pt film having a thickness of 0.2 μm, and an Au film having a thickness of 1 μm.

Patterning was then performed using a typical photolithography technique and etching technique, thus patterning the Au—Ge—Ni alloy film, the Pt film and the Au film, and forming an n-type ohmic electrode that functioned as the first electrode.

Next, a surface roughening treatment was performed on the surface of the light extraction surface, namely the surface from which the GaAs had been removed.

Next, the epilayers were removed selectively from a region in which a p-type ohmic electrode was to be formed as the second electrode, thus exposing the strain adjustment layer. A vacuum deposition method was then used to sequentially deposit an AuBe film having a thickness of 0.2 μm and an Au film having a thickness of 1 μm on the surface of the exposed strain adjustment layer, and the AuBe film and the Au film were then subjected to patterning, thus forming a p-type ohmic electrode. Subsequently, alloying was performed by conducting a heat treatment at 450° C. for 10 minutes, thus completing the formation of low-resistance p-type and n-type ohmic electrodes.

Next, a third electrode for connection was formed on the back surface of the functional substrate by depositing an Au film of thickness 0.2 μm, a Pt film of thickness 0.2 μm, and an AuSn film of thickness 1.2 μm.

Next, a dicing saw was used to cut V-shaped slots in those regions on the back surface of the functional substrate in which the third electrode was not formed, with the dimensions of the V-shaped slots set so as to yield an angle α for the inclined surfaces of 70° and a vertical surface thickness of 80 μm.

Subsequently, a dicing saw was used to cut the structure from the side of the compound semiconductor layer at intervals of 350 μm, thus forming a series of chips. Fractured layers and soiling caused by the dicing were removed using a mixed solution of sulfuric acid and hydrogen peroxide, thus completing preparation of light emitting diodes of Example 1.

One hundred light emitting diode lamps were assembled, with each lamp prepared by mounting a light emitting diode chip of Example 1, prepared in the manner described above, on a mounting substrate. Each of these light emitting diode lamps was assembled by performing thermal bonding inside a eutectic die bonder to mount the light emitting diode chip on the mounting substrate, wire bonding the n-type ohmic electrode of the light emitting diode to the n-electrode terminal provided on the surface of the mounting substrate using a gold wire, wire bonding the p-type ohmic electrode to the p-electrode terminal using a gold wire, and then sealing the lamp with a typical epoxy resin.

The results of evaluating the properties of these light emitting diode lamps prepared by mounting the light emitting diodes of Example 1 are shown in Table 2. As is evident from Table 1, when an electric current was passed between the n-type and p-type ohmic electrodes, red light with a peak wavelength of 661.3 nm was emitted.

The forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 3.6 mW. The fluctuation in the peak emission wavelength (maximum - minimum) across all of the assembled light emitting diodes was 2.5 nm, which represents a favorable result. A fluctuation in the peak emission wavelength (maximum - minimum) of 3 nm or less is considered favorable.

Further, the response time (Tr) indicating the emission rise time was 10.6 ns, and no surface defects were observed.

In the light emitting diode of Example 1, a reduction in output was observed when the forward current was a large current (for example, 150 mA or higher).

The above results confirmed that although the light emitting diode of Example 1 satisfied the desired value for the response time (of 35 ns or less), a reduction in output was observed when the light emitting diode was used with a large current (for example, 150 mA or higher), and therefore this light emitting diode is appropriate for fields in which a current smaller than 150 mA is passed through the device.

Example 2

The light emitting diode of Example 2 was formed in the same manner as the light emitting diode of Example 1, with the exceptions of forming two of the strained light emitting layers provided in the light emitting diode of Example 1, and forming one barrier layer having a thickness of 30 nm and a composition of $(Al_{0.53}Ga_{0.47})_{0.5}In_{0.5}P$.

In other words, in Example 2, the light emitting layer had a structure composed of two strained light emitting layers (combined thickness: 20 nm) and one barrier layer (thickness: 30 nm). In this case, the total thickness of the light emitting layer of Example 2 was 50 nm.

The results of evaluating the properties of light emitting diode lamps prepared by mounting the light emitting diodes of Example 2 are shown in Table 1. As is evident from Table 1, when an electric current was passed between the n-type and p-type ohmic electrodes, red light with a peak wavelength of 660.8 nm was emitted.

Further, the forward voltage (Vf) observed when an electric current of 20 milliamperes (mA) flowed through the device in the forward direction was approximately 1.8 volts (V). Further, the emission output when the forward current was 20 mA was 4.5 mW. The fluctuation in the peak emission wavelength across all of the assembled light emitting diodes was 2.4 nm. The response time (Tr) indicating the emission rise time was 15.2 ns. Furthermore, no surface defects were observed.

The above results confirmed that according to the light emitting diode and light emitting diode lamp of Example 2, a light emitting layer that emitted light having an emission wavelength of 655 nm or greater could be formed, and a response time of 35 ns or less (15.2 ns in this case) could be achieved.

Example 3

The light emitting diode of Example 3 was formed in the same manner as the light emitting diode of Example 2, with the exceptions of altering the number of strained light emitting layers provided in the light emitting diode from two layers to three layers, and forming two of the barrier layers provided in the light emitting diode of Example 2.

In other words, in Example 3, the light emitting layer had a structure composed of three strained light emitting layers (combined thickness: 30 nm) and two barrier layers (combined thickness: 60 nm). In this case, the total thickness of the light emitting layer of Example 3 was 90 nm.

The results of evaluating the properties of light emitting diode lamps prepared by mounting the light emitting diodes of Example 3 are shown in Table 1. As is evident from Table 1, when an electric current was passed between the n-type and p-type ohmic electrodes, red light with a peak wavelength of 660.7 nm was emitted.

Further, the forward voltage (Vf) observed when an electric current of 20 milliamperes (mA) flowed through the device in the forward direction was approximately 1.8 volts (V). Further, the emission output when the forward current was 20 mA was 4.1 mW. The fluctuation in the peak emission wavelength across all of the assembled light emitting diode lamps was 2.3 nm. The response time (Tr) indicating the emission rise time was 18.4 ns. Furthermore, no surface defects were observed.

The above results confirmed that according to the light emitting diode and light emitting diode lamp of Example 3, a light emitting layer that emitted light having an emission wavelength of 655 nm or greater could be formed, and a response time of 35 ns or less (18.4 ns in this case) could be achieved.

Example 4

The light emitting diode of Example 4 was formed in the same manner as the light emitting diode of Example 3, with the exceptions of altering the number of strained light emitting layers provided in the light emitting diode from three layers to five layers, and altering the number of barrier layers provided in the light emitting diode of Example 3 from two layers to four layers.

In other words, in Example 4, the light emitting layer had a structure composed of five strained light emitting layers (combined thickness: 50 nm) and four barrier layers (combined thickness: 120 nm). In this case, the total thickness of the light emitting layer of Example 4 was 170 nm.

The results of evaluating the properties of light emitting diode lamps prepared by mounting the light emitting diodes of Example 4 are shown in Table 1. As is evident from Table 1, when an electric current was passed between the n-type and p-type ohmic electrodes, red light with a peak wavelength of 660.2 nm was emitted.

Further, the forward voltage (Vf) observed when an electric current of 20 milliamperes (mA) flowed through the device in the forward direction was approximately 1.9 volts (V). Further, the emission output when the forward current was 20 mA was 3.9 mW. The fluctuation in the peak emission wavelength across all of the assembled light emitting diode lamps was 2.3 nm. The response time (Tr) indicating the emission rise time was 28 ns. Furthermore, no surface defects were observed.

The above results confirmed that according to the light emitting diode and light emitting diode lamp of Example 4, a light emitting layer that emitted light having an emission wavelength of 655 nm or greater could be formed, and a response time of 35 ns or less (28 ns in this case) could be achieved.

Example 5

The light emitting diode of Example 5 was formed in the same manner as the light emitting diode of Example 4, with the exceptions of altering the number of strained light emitting layers provided in the light emitting diode from five layers to seven layers, and altering the number of barrier layers provided in the light emitting diode of Example 4 from four layers to six layers.

In other words, in Example 5, the light emitting layer had a structure composed of seven strained light emitting layers (combined thickness: 70 nm) and six barrier layers (combined thickness: 180 nm). In this case, the total thickness of the light emitting layer of Example 5 was 250 nm.

The results of evaluating the properties of light emitting diode lamps prepared by mounting the light emitting diodes of Example 5 are shown in Table 1. As is evident from Table 1, when an electric current was passed between the n-type and p-type ohmic electrodes, red light with a peak wavelength of 660.1 nm was emitted.

Further, the forward voltage (Vf) observed when an electric current of 20 milliamperes (mA) flowed through the device in the forward direction was approximately 1.9 volts (V). Further, the emission output when the forward current was 20 mA was 3.8 mW. The fluctuation in the peak emission wavelength across all of the assembled light emitting diode lamps was 2.3 nm. The response time (Tr) indicating the emission rise time was 32.6 ns. Furthermore, no surface defects were observed.

The above results confirmed that according to the light emitting diode and light emitting diode lamp of Example 5, a light emitting layer that emitted light having an emission wavelength of 655 nm or greater could be formed, and a response time of 35 ns or less (32.6 ns in this case) could be achieved.

Example 6

The light emitting diode of Example 6 was formed in the same manner as the light emitting diode of Example 1, with the exceptions of altering the composition of the strained light emitting layer provided in the light emitting diode of Example 1 to $Ga_{0.44}In_{0.56}P$, and altering the thickness of the strained light emitting layer to 17 nm. In other words, in Example 6, the light emitting layer is composed of a single strained light emitting layer (having a thickness of 17 nm). Namely, the thickness of the light emitting layer in Example 6 was 17 nm.

The results of evaluating the properties of light emitting diode lamps prepared by mounting the light emitting diodes of Example 6 are shown in Table 1. As is evident from Table 1, when an electric current was passed between the n-type and p-type ohmic electrodes, red light with a peak wavelength of 661.1 nm was emitted.

Further, the forward voltage (Vf) observed when an electric current of 20 milliamperes (mA) flowed through the device in the forward direction was approximately 1.8 volts (V). Further, the emission output when the forward current was 20 mA was 3.9 mW. The fluctuation in the peak emission wavelength across all of the assembled light emitting diode lamps was 2.2 nm. The response time (Tr) indicating the emission rise time was 17 ns. Furthermore, no surface defects were observed.

Furthermore, in the light emitting diode of Example 6, a reduction in output was observed when the forward current was a large current (for example, 150 mA or higher).

The above results confirmed that although the light emitting diode of Example 6 satisfied the desired value for the response time (of 35 ns or less), a reduction in output was observed when the light emitting diode was used with a large current (for example, 150 mA or higher), and therefore this light emitting diode is appropriate for fields in which a current smaller than 150 mA is passed through the device.

Example 7

The light emitting diode of Example 7 was formed in the same manner as the light emitting diode of Example 2, with the exceptions of altering the composition of the strained light emitting layers provided in the light emitting diode of Example 2 to $Ga_{0.44}In_{0.56}P$, altering the thickness of each strained light emitting layer to 17 nm, and altering the thickness of the barrier layer to 19 nm. In other words, in Example 7, the light emitting layer is composed of two strained light emitting layers (combined thickness: 34 nm) and one barrier layer (thickness: 19 nm). The thickness of the light emitting layer in Example 7 was 53 nm.

The results of evaluating the properties of light emitting diode lamps prepared by mounting the light emitting diodes of Example 7 are shown in Table 1. As is evident from Table 1, when an electric current was passed between the n-type and p-type ohmic electrodes, red light with a peak wavelength of 661.0 nm was emitted.

Further, the forward voltage (Vf) observed when an electric current of 20 milliamperes (mA) flowed through the device in the forward direction was approximately 1.8 volts (V). Further, the emission output when the forward current was 20 mA was 4.3 mW. The fluctuation in the peak emission wavelength across all of the assembled light emitting diode lamps was 2.1 nm. The response time (Tr) indicating the emission rise time was 21.2 ns. Furthermore, no surface defects were observed.

The above results confirmed that according to the light emitting diode and light emitting diode lamp of Example 7, a light emitting layer that emitted light having an emission wavelength of 655 nm or greater could be formed, and a response time of 35 ns or less (21.2 ns in this case) could be achieved.

Example 8

The light emitting diode of Example 8 was formed in the same manner as the light emitting diode of Example 3, with the exceptions of altering the composition of the strained light emitting layers provided in the light emitting diode of Example 3 to $Ga_{0.44}In_{0.56}P$, altering the thickness of each strained light emitting layer to 17 nm, and altering the thickness of each barrier layer to 19 nm. In other words, in Example 8, the light emitting layer is composed of three strained light emitting layers (combined thickness: 51 nm) and two barrier layers (combined thickness: 38 nm). The thickness of the light emitting layer in Example 8 was 89 nm.

The results of evaluating the properties of light emitting diode lamps prepared by mounting the light emitting diodes of Example 8 are shown in Table 1. As is evident from Table 1, when an electric current was passed between the n-type and p-type ohmic electrodes, red light with a peak wavelength of 660.5 nm was emitted.

Further, the forward voltage (Vf) observed when an electric current of 20 milliamperes (mA) flowed through the device in the forward direction was approximately 1.8 volts (V). Further, the emission output when the forward current was 20 mA was 4.2 mW. The fluctuation in the peak emission wavelength across all of the assembled light emitting diode lamps was 2.1 nm. The response time (Tr) indicating the emission rise time was 26.2 ns. Furthermore, no surface defects were observed.

The above results confirmed that according to the light emitting diode and light emitting diode lamp of Example 8, a light emitting layer that emitted light having an emission wavelength of 655 nm or greater could be formed, and a response time of 35 ns or less (26.2 ns in this case) could be achieved.

Example 9

The light emitting diode of Example 9 was formed in the same manner as the light emitting diode of Example 8, with the exception of altering the number of strained light emitting layers provided and the number of barrier layers provided in the light emitting diode of Example 8.

In other words, in Example 9, the light emitting layer of the light emitting diode had a structure composed of six strained light emitting layers (combined thickness: 102 nm) and five barrier layers (combined thickness: 95 nm). The total thickness of the light emitting layer of Example 9 was 197 nm.

The results of evaluating the properties of light emitting diode lamps prepared by mounting the light emitting diodes of Example 9 are shown in Table 1. As is evident from Table 1, when an electric current was passed between the n-type and p-type ohmic electrodes, red light with a peak wavelength of 660.3 nm was emitted.

Further, the forward voltage (Vf) observed when an electric current of 20 milliamperes (mA) flowed through the device in the forward direction was approximately 1.9 volts (V). Further, the emission output when the forward current was 20 mA was 4 mW. The fluctuation in the peak emission wavelength across all of the assembled light emitting diode lamps was 2.1 nm. The response time (Tr) indicating the emission rise time was 34.3 ns. Furthermore, no surface defects were observed.

The above results confirmed that according to the light emitting diode and light emitting diode lamp of Example 9, a light emitting layer that emitted light having an emission wavelength of 655 nm or greater could be formed, and a response time of 35 ns or less (34.3 ns in this case) could be achieved.

Example 10

The light emitting diode of Example 10 was formed in the same manner as the light emitting diode of Example 5, with the exceptions of altering the composition of the strained light emitting layers provided in the light emitting diode of Example 5 to $Ga_{0.37}In_{0.63}P$, and altering the thickness of each strained light emitting layer to 8 nm.

The results of evaluating the properties of light emitting diode lamps prepared by mounting the light emitting diodes of Example 10 are shown in Table 1. As is evident from Table 1, when an electric current was passed between the n-type and p-type ohmic electrodes, red light with a peak wavelength of 672.0 nm was emitted.

Further, the forward voltage (Vf) observed when an electric current of 20 milliamperes (mA) flowed through the device in the forward direction was approximately 1.8 volts (V). Further, the emission output when the forward current was 20 mA was 3.8 mW. The fluctuation in the peak emission wavelength across all of the assembled light emitting diode lamps was 2.6 nm. The response time (Tr) indicating the emission rise time was 31.3 ns. Furthermore, no surface defects were observed.

The above results confirmed that according to the light emitting diode and light emitting diode lamp of Example 10, a light emitting layer that emitted light having an emission wavelength of 655 nm or greater could be formed, and a response time of 35 ns or less (31.3 ns in this case) could be achieved.

Example 11

The light emitting diode of Example 11 was formed in the same manner as the light emitting diode of Example 3, with the exceptions of altering the composition of the strained light emitting layers provided in the light emitting diode of Example 3 to $Ga_{0.46}In_{0.54}P$, altering the thickness of each strained light emitting layer to 30 nm, and altering the thickness of each barrier layer to 45 nm.

The results of evaluating the properties of light emitting diode lamps prepared by mounting the light emitting diodes of Example 11 are shown in Table 1. As is evident from Table 1, when an electric current was passed between the n-type and p-type ohmic electrodes, red light with a peak wavelength of 660.9 nm was emitted.

Further, the forward voltage (Vf) observed when an electric current of 20 milliamperes (mA) flowed through the device in the forward direction was approximately 1.9 volts (V). Further, the emission output when the forward current was 20 mA was 3.3 mW. The fluctuation in the peak emission wavelength across all of the assembled light emitting diode lamps was 1.8 nm. The response time (Tr) indicating the emission rise time was 29 ns. Furthermore, no surface defects were observed.

The above results confirmed that according to the light emitting diode and light emitting diode lamp of Example 11, a light emitting layer that emitted light having an emission wavelength of 655 nm or greater could be formed, and a response time of 35 ns or less (29 ns in this case) could be achieved.

Furthermore, the above results for Examples 1 to 11 confirmed that by producing a light emitting diode containing a pn junction-type light emitting unit having a light emitting layer composed of n (>1) strained light emitting layers and (n−1) barrier layers laminated in an alternating arrangement, wherein the number of laminated strained light emitting layers was from 1 to 7, and the thickness of the light emitting layer was not more than 250 nm, a light emitting diode having a response time of 35 nm or less (namely, a light emitting diode having a rapid response time) could be obtained.

Example 12

In the light emitting diode of Example 12 (according to the second embodiment), compound semiconductor layers were laminated sequentially on top of a GaAs substrate composed of monocrystalline Si-doped n-type GaAs in the same manner as that described for Example 1, thus forming an epitaxial wafer.

However, instead of using the light emitting layer provided in the light emitting diode of Example 1, two strained light emitting layers composed of undoped $Ga_{0.42}In_{0.58}P$, and one barrier layer (having a single layer thickness of 30 nm) having a composition formula of $(Al_{0.53}Ga_{0.47})_{0.5}In_{0.5}P$ were laminated in an alternating arrangement to form the light emitting layer.

Next, the strain adjustment layer was polished down to a depth of approximately 1 μm from the surface, forming a mirror finish. This mirror finishing reduced the roughness of the strain adjustment layer surface to 0.18 nm.

Subsequently, an AuBe layer (thickness: 100 nm) and an Au layer (thickness: 150 nm) were deposited sequentially on the strain adjustment layer to form an AuBe/Au laminated film, and a typical photolithography technique and etching technique were then used to pattern the AuBe/Au laminated film, thus forming the second electrode.

Next, an ITO film (thickness: 300 nm) that functions as a transparent conductive film that covers the second electrode, and a reflective layer composed of a laminated film of Ag alloy (thickness: 500 nm)/W (thickness: 100 nm)/Pt (thickness: 200 nm)/Au (thickness: 500 nm)/AuGe (thickness: 1,000 nm) were formed sequentially on top of the strain adjustment layer, thus forming a reflective structure.

Next, using the method described for the second embodiment, a functional substrate having a three-layer structure (thickness: 85 μm) represented by Cu (30 μm)/Mo (25 μm)/Cu (30 μm) (namely, a metal substrate (thermal conductivity: 250 W/m·K)) was produced.

The coefficient of thermal expansion for this functional substrate of Example 12 was 6.1 ppm/K and the thermal conductivity was 250 W/m·K. Further, the diameter of the functional substrate was 76 mm, and the thickness was 85 μm.

Next, the inside of a reduced pressure apparatus was evacuated down to $3 \times 10^{-5}$ Pa, and with the GaAs substrate and the functional substrate heated at 400° C., a load of 100 g/cm² was applied to bond the reflective structure to the functional substrate, thus forming a bonded structure.

Next, the GaAs substrate and the GaAs buffer layer were selectively removed from the bonded structure using an ammonia-based etchant. Subsequently, a vacuum deposition method was used to sequentially deposit, on the surface of the contact layer, an Au—Ge—Ni alloy film having a thickness of 0.5 μm, a Pt film having a thickness of 0.2 μm, and an Au film having a thickness of 1 μm.

Patterning of the Au—Ge—Ni alloy film, the Pt film and the Au film was then performed using a typical photolithography technique and etching technique, thus forming an n-type ohmic electrode that functioned as the first electrode. Subsequently, a conventional technique was used to pattern the contact layer to a shape that matched the shape of the first electrode.

Next, a surface roughening treatment was performed on the surface of the light extraction surface, namely the surface from which the GaAs had been removed.

Next, the epilayers were removed selectively from a region in which a p-type ohmic electrode was to be formed as the second electrode, thus exposing the strain adjustment layer. A vacuum deposition method was then used to sequentially deposit an AuBe film having a thickness of 0.2 µm and an Au film having a thickness of 1 µm on the surface of the exposed strain adjustment layer, and the AuBe film and the Au film were then subjected to patterning, thus forming the second electrode (p-type ohmic electrode). Subsequently, alloying was performed by conducting a heat treatment at 450° C. for 10 minutes, thus completing the formation of low-resistance first and second electrodes (n-type and p-type ohmic electrodes).

Subsequently, a dicing saw was used to cut the bonded structure on which the first and second electrodes had been formed, thus forming a series of chips. This completed production of light emitting diodes of Example 12.

One hundred light emitting diode lamps were assembled, with each lamp prepared by mounting a light emitting diode chip of Example 12, prepared in the manner described above, on a mounting substrate. Each of these light emitting diode lamps was assembled by performing thermal bonding inside a eutectic die bonder to mount the light emitting diode chip on the mounting substrate, wire bonding the n-type ohmic electrode of the light emitting diode to the n-electrode terminal provided on the surface of the mounting substrate using a gold wire, wire bonding the p-type ohmic electrode to the p-electrode terminal using a gold wire, and then sealing the lamp with a typical epoxy resin.

A portion of the structural elements of the light emitting diode of Example 12 are shown in Table 1, and the results of evaluating the properties of these light emitting diode lamps prepared by mounting the light emitting diodes of Example 12 are shown in Table 2.

As is evident from Table 2, when an electric current was passed between the n-type and p-type ohmic electrodes, red light with a peak wavelength of 661.2 nm (a value greater than 655 nm) was emitted.

Further, the forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 4.4 mW (greater than 3 mW), which represents a favorable result.

The fluctuation in the peak emission wavelength (maximum–minimum) across all of the assembled light emitting diodes was 2.2 nm, which represents a favorable result. A fluctuation in the peak emission wavelength (maximum–minimum) of 3 nm or less is considered favorable.

Further, the response time (Tr) indicating the emission rise time was 18.2 ns, which represents a favorable result of 100 ns or less. Furthermore, in a surface defect inspection, no surface defects were observed.

Furthermore, upon emission of light from the light emitting diode of Example 12, the heat dissipation effect of the functional substrate meant that no reduction in light emission efficiency caused by temperature increase was observed.

The above results confirmed that according to the light emitting diode and light emitting diode lamp of Example 12, a light emitting layer that emitted light having an emission wavelength of 655 nm or greater could be formed, and a response time of 100 ns or less (18.2 ns in this case) could be achieved.

Moreover, it was also confirmed that because of the heat dissipation effect of the functional substrate, a light emitting diode having excellent heat dissipation properties could be obtained.

Example 13

The light emitting diode of Example 13 (according to the third embodiment) was produced in the same manner as the light emitting diode of Example 12, with the exception of replacing the functional substrate having a three-layer structure (thickness: 85 µm) represented by Cu (30 µm)/Mo (25 µm)/Cu (30 µm), and instead using a GaP layer (thermal conductivity: 110 W/mK) having a thickness of 150 µm as the functional substrate.

A portion of the structural elements of the light emitting diode of Example 13 are shown in Table 1, and the results of evaluating the properties of the light emitting diode lamps prepared by mounting the light emitting diode of Example 13 are shown in Table 2.

As is evident from Table 2, when an electric current was passed between the n-type and p-type ohmic electrodes, red light with a peak wavelength of 660.6 nm (a value greater than 655 nm) was emitted.

Further, the forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 4.2 mW (greater than 3 mW), which represents a favorable result.

The fluctuation in the peak emission wavelength (maximum–minimum) across all of the assembled light emitting diodes was 2.3 nm, which represents a favorable result. Further, the response time (Tr) indicating the emission rise time was 23.3 ns, which represents a favorable result of 100 ns or less. Furthermore, in a surface defect inspection, no surface defects were observed.

Furthermore, upon emission of light from the light emitting diode of Example 13, the heat dissipation effect of the functional substrate meant that no reduction in light emission efficiency caused by temperature increase was observed.

The above results confirmed that according to the light emitting diode and light emitting diode lamp of Example 13, a light emitting layer that emitted light having an emission wavelength of 655 nm or greater could be formed, and a response time of 100 ns or less (23.3 ns in this case) could be achieved.

Moreover, it was also confirmed that because of the heat dissipation effect of the functional substrate, a light emitting diode having excellent heat dissipation properties could be obtained.

Example 14

The light emitting diode of Example 14 (according to the third embodiment) was produced in the same manner as the light emitting diode of Example 13, with the exception of replacing the GaP layer (thermal conductivity: 110 W/mK) having a thickness of 150 μm as the functional substrate, and instead using a Ge layer (thermal conductivity: 60 W/mK) having a thickness of 100 μm as the functional substrate.

A portion of the structural elements of the light emitting diode of Example 14 are shown in Table 1, and the results of evaluating the properties of the light emitting diode lamps prepared by mounting the light emitting diode of Example 14 are shown in Table 2.

As is evident from Table 2, when an electric current was passed between the n-type and p-type ohmic electrodes, red light with a peak wavelength of 660.5 nm (a value greater than 655 nm) was emitted.

Further, the forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 4.3 mW (greater than 3 mW), which represents a favorable result.

The fluctuation in the peak emission wavelength (maximum−minimum) across all of the assembled light emitting diodes was 2.4 nm, which represents a favorable result. Further, the response time (Tr) indicating the emission rise time was 20.5 ns, which represents a favorable result of 100 ns or less. Furthermore, in a surface defect inspection, no surface defects were observed.

Furthermore, upon emission of light from the light emitting diode of Example 14, the heat dissipation effect of the functional substrate meant that no reduction in light emission efficiency caused by temperature increase was observed.

The above results confirmed that according to the light emitting diode and light emitting diode lamp of Example 14, a light emitting layer that emitted light having an emission wavelength of 655 nm or greater could be formed, and a response time of 100 ns or less (20.5 ns in this case) could be achieved.

Moreover, it was also confirmed that because of the heat dissipation effect of the functional substrate, a light emitting diode having excellent heat dissipation properties could be obtained.

Example 15

The light emitting diode of Example 15 (according to the third embodiment) was produced in the same manner as the light emitting diode of Example 13, with the exception of replacing the GaP layer (thermal conductivity: 110 W/mK) having a thickness of 150 μm as the functional substrate, and instead using a Si layer (thermal conductivity: 126 W/mK) having a thickness of 100 μm as the functional substrate.

A portion of the structural elements of the light emitting diode of Example 15 are shown in Table 1, and the results of evaluating the properties of the light emitting diode lamps prepared by mounting the light emitting diode of Example 15 are shown in Table 2.

As is evident from Table 2, when an electric current was passed between the n-type and p-type ohmic electrodes, red light with a peak wavelength of 660.7 nm (a value greater than 655nm) was emitted.

Further, the forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 4.3 mW (greater than 3 mW), which represents a favorable result.

The fluctuation in the peak emission wavelength (maximum−minimum) across all of the assembled light emitting diodes was 2.3 nm, which represents a favorable result. Further, the response time (Tr) indicating the emission rise time was 22.8 ns, which represents a favorable result of 100 ns or less. Furthermore, in a surface defect inspection, no surface defects were observed.

Furthermore, upon emission of light from the light emitting diode of Example 15, the heat dissipation effect of the functional substrate meant that no reduction in light emission efficiency caused by temperature increase was observed.

The above results confirmed that according to the light emitting diode and light emitting diode lamp of Example 15, a light emitting layer that emitted light having an emission wavelength of 655 nm or greater could be formed, and a response time of 100 ns or less (22.8 ns in this case) could be achieved.

Moreover, it was also confirmed that because of the heat dissipation effect of the functional substrate, a light emitting diode having excellent heat dissipation properties could be obtained.

Example 16

The light emitting diode of Example 16 (according to the second embodiment) was produced in the same manner as the light emitting diode of Example 12, with the exception of replacing the light emitting layer provided in the light emitting diode of Example 12, and instead using a light emitting layer containing two strained light emitting layers composed of undoped $Ga_{0.38}In_{0.62}P$ and one barrier layer (having a single layer thickness of 30 nm) having a composition of $(Al_{0.53}Ga_{0.47})_{0.5}In_{0.5}P$ laminated in an alternating arrangement.

A portion of the structural elements of the light emitting diode of Example 16 are shown in Table 1, and the results of evaluating the properties of the light emitting diode lamps prepared by mounting the light emitting diode of Example 16 are shown in Table 2.

As is evident from Table 2, when an electric current was passed between the n-type and p-type ohmic electrodes, red light with a peak wavelength of 675.2 nm (a value greater than 655 nm) was emitted.

Further, the forward voltage (Vf) observed when an electric current of 20 milliamperes (mA) flowed through the device in the forward direction was approximately 1.8 volts (V), reflecting the low resistance at the bonding interface between the strain adjustment layer of the compound semiconductor layer and the functional substrate, and the favorable ohmic properties of each of the ohmic electrodes.

The light emission output when the forward current was 20 mA was 3.6 mW (greater than 3 mW), which represents a favorable result.

The fluctuation in the peak emission wavelength (maximum−minimum) across all of the assembled light emitting diodes was 2.5 nm, which represents a favorable result. Further, the response time (Tr) indicating the emission use time was 24.3 ns, which represents a favorable result of 100 ns or less. Furthermore, in a surface defect inspection, no surface defects were observed.

Furthermore, upon emission of light from the light emitting diode of Example 16, the heat dissipation effect of the functional substrate meant that no reduction in light emission efficiency caused by temperature increase was observed.

The above results confirmed that according to the light emitting diode and light emitting diode lamp of Example 16, a light emitting layer that emitted light having an emission wavelength of 655 nm or greater could be formed, and a response time of 100 ns or less (24.3 ns in this case) could be achieved.

Moreover, it was also confirmed that because of the heat dissipation effect of the functional substrate, a light emitting diode having excellent heat dissipation properties could be obtained.

Comparative Example 1

The light emitting diode of Comparative Example 1 was prepared in the same manner as the light emitting diode of Example 2, with the exception of altering the number of strained light emitting layers and the number of barrier layers provided.

In Comparative Example 1, the light emitting layer of the light emitting diode was formed from 11 strained light emitting layers (combined thickness: 110 nm) and 10 barrier layers (combined thickness: 300 nm). The total thickness of the light emitting layer of Comparative Example 1 was 410 nm.

The results of evaluating the properties of light emitting diode lamps prepared by mounting the light emitting diodes of Comparative Example 1 are shown in Table 2. As is evident from Table 2, when an electric current was passed between the n-type and p-type ohmic electrodes, red light with a peak wavelength of 660.5 nm was emitted.

Further, the forward voltage (Vf) observed when an electric current of 20 milliamperes (mA) flowed through the device in the forward direction was approximately 2 volts (V). Further, the emission output when the forward current was 20 mA was 3.7 mW. The fluctuation in the peak emission wavelength across all of the assembled light emitting diode lamps was 2.4 nm. The response time (Tr) indicating the emission rise time was 43 ns. Furthermore, no surface defects were observed.

The above results confirmed that according to the light emitting diode and light emitting diode lamp of Comparative Example 1, in which the thickness of the light emitting layer was 410 nm, a response time of 35 ns or less could not be achieved (43 ns in this case).

Comparative Example 2

The light emitting diode of Comparative Example 2 was prepared in the same manner as the light emitting diode of Example 7, with the exception of altering the number of strained light emitting layers and the number of barrier layers provided.

In Comparative Example 2, the light emitting layer of the light emitting diode was formed from 12 strained light emitting layers (combined thickness: 204 nm) and 11 barrier layers (combined thickness: 209 nm). The total thickness of the light emitting layer of Comparative Example 2 was 413 nm.

The results of evaluating the properties of light emitting diode lamps prepared by mounting the light emitting diodes of Comparative Example 2 are shown in Table 2. As is evident from Table 2, when an electric current was passed between the n-type and p-type ohmic electrodes, red light with a peak wavelength of 659.5 nm was emitted.

Further, the forward voltage (Vf) observed when an electric current of 20 milliamperes (mA) flowed through the device in the forward direction was approximately 1.9 volts (V). Further, the emission output when the forward current was 20 mA was 3.9 mW. The fluctuation in the peak emission wavelength across all of the assembled light emitting diode lamps was 2.2 nm. The response time (Tr) indicating the emission rise time was 50 ns. Furthermore, no surface defects were observed.

The above results confirmed that according to the light emitting diode and light emitting diode lamp of Comparative Example 2, in which the thickness of the light emitting layer was 413 nm, a response time of 35 ns or less could not be achieved (50 ns in this case).

Comparative Example 3

The light emitting diode of Comparative Example 3 was prepared in the same manner as the light emitting diode of Example 2, with the exceptions of altering the composition, thickness and number of strained light emitting layers, and altering the number of barrier layers.

The composition of the strained light emitting layer was altered to $Ga_{0.38}In_{0.62}P$. The thickness of each strained light emitting layer was set to 5 nm. Furthermore, the number of strained light emitting layers was set to 21, and the number of barrier layers was set to 20.

In other words, in Comparative Example 3, the light emitting layer of the light emitting diode was formed from 21 strained light emitting layers (combined thickness: 105 nm), and 20 barrier layers (combined thickness: 600 nm). The total thickness of the light emitting layer of Comparative Example 3 was 705 nm.

The results of evaluating the properties of light emitting diode lamps prepared by mounting the light emitting diodes of Comparative Example 3 are shown in Table 2. As is evident from Table 2, when an electric current was passed between the n-type and p-type ohmic electrodes, red light with a peak wavelength of 651.5 nm was emitted.

Further, the forward voltage (Vf) observed when an electric current of 20 milliamperes (mA) flowed through the device in the forward direction was approximately 2 volts (V). Further, the emission output when the forward current was 20 mA was 3.1 mW. The fluctuation in the peak emission wavelength across all of the assembled light emitting diode lamps was 5.1 nm. The response time (Tr) indicating the emission rise time was 42 ns. Furthermore, no surface defects were observed.

The above results confirmed that if the number of strained light emitting layers that constitute the light emitting layer is within the range of 1 to 7 (5 in this case), and the total thickness of the light emitting layer exceeds 250 nm (705 nm in this case), then the response time (Tr) for the emission rise time is slower than 35 ns.

Comparative Example 4

The light emitting diode of Comparative Example 4 was prepared in the same manner as the light emitting diode of Example 2, with the exception of altering the number of strained light emitting layers and the number of barrier layers provided. Specifically, in Comparative Example 4, the number of strained light emitting layers was set to 21, and the number of barrier layers was set to 20.

In other words, in Comparative Example 4, the light emitting layer of the light emitting diode was formed from 21 strained light emitting layers (combined thickness: 210 nm), and 20 barrier layers (combined thickness: 600 nm). The total thickness of the light emitting layer of Comparative Example 4 was 810 nm.

The results of evaluating the properties of light emitting diode lamps prepared by mounting the light emitting diodes of Comparative Example 4 are shown in Table 2. As is evident from Table 2, when an electric current was passed between the n-type and p-type ohmic electrodes, red light with a peak wavelength of 660 nm was emitted.

Further, the forward voltage (Vf) observed when an electric current of 20 milliamperes (mA) flowed through the device in the forward direction was approximately 2 volts (V).

Furthermore, the emission output when the forward current was 20 mA was 2.5 mW. The fluctuation in the peak emission wavelength across all of the assembled light emitting diode lamps was 7.1 nm. The response time (Tr) indicating the emission rise time was 65 ns. Furthermore, no surface defects were observed.

The above results confirmed that in the light emitting diode and light emitting diode lamp of Comparative Example 4, in which the thickness of the light emitting layer was 810 nm, a response time (Tr) of 35 ns or less could not be achieved (65 ns in this case).

TABLE 1

| | Composition of functional substrate | Thermal conductivity of functional substrate (W/mK) | Reflective structure | Strained light emitting layer | Value of X in light emitting layer $Ga_XIn_{(1-X)}P$ | Thickness of strained light emitting layer (nm) | Number of strained light emitting layers | Total thickness of strained light emitting layers (nm) | Thickness of barrier layer (nm) | Number of barrier layers |
|---|---|---|---|---|---|---|---|---|---|---|
| Example 1 | GaP layer (150 μm) | 110 | 110 | GaP layer | 0.42 | 10 | 1 | 10 | | 0 |
| Example 2 | GaP layer (150 μm) | 110 | no | GaP layer | 0.42 | 10 | 2 | 20 | 30 | 1 |
| Example 3 | GaP layer (150 μm) | 110 | no | GaP layer | 0.42 | 10 | 3 | 30 | 30 | 2 |
| Example 4 | GaP layer (150 μm) | 110 | no | GaP layer | 0.42 | 10 | 5 | 50 | 30 | 4 |
| Example 5 | GaP layer (150 μm) | 110 | no | GaP layer | 0.42 | 10 | 7 | 70 | 30 | 6 |
| Example 6 | GaP layer (150 μm) | 110 | no | GaP layer | 0.44 | 17 | 1 | 17 | | 0 |
| Example 7 | GaP layer (150 μm) | 110 | no | GaP layer | 0.44 | 17 | 2 | 34 | 19 | 1 |
| Example 8 | GaP layer (150 μm) | 110 | no | GaP layer | 0.44 | 17 | 3 | 51 | 19 | 2 |
| Example 9 | GaP layer (150 μm) | 110 | no | GaP layer | 0.44 | 17 | 6 | 102 | 19 | 5 |
| Example 10 | GaP layer (150 μm) | 110 | no | GaP layer | 0.37 | 8 | 7 | 56 | 30 | 6 |
| Example 11 | GaP layer (150 μm) | 110 | no | GaP layer | 0.46 | 30 | 3 | 90 | 45 | 2 |
| Example 12 | Cu layer (30 μm)/ Mo layer (25 μm)/ Cu layer (30 μm) | 250 | yes | GaP layer | 0.42 | 10 | 2 | 20 | 30 | 1 |
| Example 13 | GaP layer (150 μm) | 110 | yes | GaP layer | 0.42 | 10 | 2 | 20 | 30 | 1 |
| Example 14 | Ge layer (100 μm) | 60 | yes | GaP layer | 0.42 | 10 | 2 | 20 | 30 | 1 |
| Example 15 | Si layer (100 μm) | 126 | yes | GaP layer | 0.42 | 10 | 2 | 20 | 30 | 1 |
| Example 16 | Cu layer (30 μm)/ Mo layer (25 μm)/ Cu layer (30 μm) | 250 | yes | GaP layer | 0.38 | 10 | 2 | 20 | 30 | 1 |
| Comparative example 1 | GaP layer (150 μm) | 110 | no | GaP layer | 0.42 | 10 | 11 | 110 | 30 | 10 |
| Comparative example 2 | GaP layer (150 μm) | 110 | no | GaP layer | 0.44 | 17 | 12 | 204 | 19 | 11 |
| Comparative example 3 | GaP layer (150 μm) | 110 | no | GaP layer | 0.38 | 5 | 21 | 105 | 30 | 20 |
| Comparative example 4 | GaP layer (150 μm) | 110 | no | $Al_{0.7}GaInP$ layer | 0.42 | 10 | 21 | 210 | 30 | 20 |

TABLE 2

| | Result of surface defect inspection | VF @ 20 mA (V) | Output 20 mA (V) | Peak emission wavelength (nm) | In-plane fluctuation in peak emission wavelength (nm) | Response time Tr (ns) | Total thickness of light emitting layer (nm) |
|---|---|---|---|---|---|---|---|
| Example 1 | ○ | 1.8 | 3.6 | 661.3 | 2.5 | 10.6 | 10 |
| Example 2 | ○ | 1.8 | 4.5 | 660.8 | 2.4 | 15.2 | 50 |
| Example 3 | ○ | 1.8 | 4.1 | 660.7 | 2.3 | 18.4 | 90 |
| Example 4 | ○ | 1.9 | 3.9 | 660.2 | 2.3 | 28 | 170 |
| Example 5 | ○ | 1.9 | 3.8 | 660.1 | 2.3 | 32.6 | 250 |
| Example 6 | ○ | 1.8 | 3.9 | 661.1 | 2.2 | 17 | 17 |
| Example 7 | ○ | 1.8 | 4.3 | 661.0 | 2.1 | 21.2 | 53 |
| Example 8 | ○ | 1.8 | 4.2 | 660.5 | 2.1 | 26.2 | 89 |
| Example 9 | ○ | 1.9 | 4 | 660.3 | 2.1 | 34.3 | 197 |
| Example 10 | ○ | 1.8 | 3.8 | 672.0 | 2.6 | 31.3 | 236 |
| Example 11 | ○ | 1.9 | 3.3 | 660.9 | 1.8 | 29 | 180 |
| Example 12 | ○ | 1.8 | 4.4 | 661.2 | 2.2 | 18.2 | 50 |
| Example 13 | ○ | 1.8 | 4.2 | 660.6 | 2.3 | 23.3 | 50 |
| Example 14 | ○ | 1.8 | 4.3 | 660.5 | 2.4 | 20.5 | 50 |
| Example 15 | ○ | 1.8 | 4.3 | 660.7 | 2.3 | 22.8 | 50 |

TABLE 2-continued

|  | Result of surface defect inspection | VF @ 20 mA (V) | Output 20 mA (V) | Peak emission wavelength (nm) | In-plane fluctuation in peak emission wavelength (nm) | Response time Tr (ns) | Total thickness of light emitting layer (nm) |
|---|---|---|---|---|---|---|---|
| Example 16 | ◯ | 1.8 | 3.6 | 675.2 | 2.5 | 24.3 | 50 |
| Comparative example 1 | ◯ | 2.0 | 3.7 | 660.5 | 2.4 | 43 | 410 |
| Comparative example 2 | ◯ | 1.9 | 3.9 | 659.5 | 2.2 | 50 | 413 |
| Comparative example 3 | ◯ | 2.0 | 3.1 | 651.5 | 5.1 | 42 | 705 |
| Comparative example 4 | ◯ | 2.0 | 2.5 | 660.0 | 7.1 | 65 | 810 |

INDUSTRIAL APPLICABILITY

The present invention relates to a light emitting diode and a light emitting diode lamp containing the light emitting diode. That is, a light emitting diode that exhibits a rapid response time and a light emitting diode lamp containing the light emitting diode are provided. The light emitting diode of the present invention can be used as a light emitting diode for plant growth, or as a light emitting diode for a high speed coupler or the like used in electrical signal transmission within a high voltage circuit or the like.

DESCRIPTION OF THE REFERENCE SIGNS

1: Light emitting diode
2: Compound semiconductor layer
3: Functional substrate
3a: Vertical surface
3b: Inclined surface
4: n-type ohmic electrode (first electrode)
5: p-type ohmic electrode (second electrode)
6: Third electrode
7: Light emitting unit
8: Strain adjustment layer
9: Lower cladding layer
10: Light emitting layer
11: Upper cladding layer
12: Strained light emitting layer
13: Barrier layer
14: GaAs substrate
15: Buffer layer
16: Contact layer
41: Light emitting diode lamp
42: Mounting substrate
43: n-electrode terminal
44: p-electrode terminal
45, 46: Gold wire
47: Epoxy resin
α: Angle
51: Light emitting diode
53: GaAs substrate
54: Reflective structure
55: Functional substrate
56: n-type ohmic electrode (first electrode)
58: p-type ohmic electrode (second electrode)
61: First metal layer
62: Second metal layer
64: Transparent conductive film
65: Reflective layer
71: Light emitting diode
72: Metal layer
73: Metal layer
75: Functional substrate

The invention claimed is:

1. A light emitting diode comprising a pn junction-type light emitting unit having a light emitting layer composed of n layers of a strained light emitting layer and n−1 layers of a barrier layer, wherein
    when a barrier layer exists, the light emitting layer has a structure in which one strained light emitting layer and one barrier layer are laminated alternately,
    n represents an integer of 1 to 7, and a thickness of the light emitting layer is not more than 250 nm,
    a composition formula of the strained light emitting layer is $(Al_XGa_{1-X})_YIn_{1-Y}P$ (wherein $0 \leq X \leq 0.1$ and $0.37 \leq Y \leq 0.46$);
    the light emitting diode further comprises a compound semiconductor layer comprising at least the light emitting unit and a strain adjustment layer laminated on the light emitting unit, and a functional substrate bonded to a surface of the strain adjustment layer: and
    wherein:
    the strain adjustment layer has a lattice constant that is smaller than a lattice constant of the strained light emitting layer and a lattice constant of GaAs,
    when a barrier layer exists, the lattice constant of the strain adjustment layer is smaller than a lattice constant of the barrier layer, and
    the strain adjustment layer has a thickness within a range of 0.5 to 20 μm.

2. The light emitting diode according to claim 1, wherein a composition formula of the strained light emitting layer is $Ga_XIn_{1-X}P$ (wherein $0.37 \leq X \leq 0.46$).

3. The light emitting diode according to claim 1, wherein the compound semiconductor layer has a light extraction surface positioned on an opposite side to the functional substrate.

4. The light emitting diode according to claim 3, wherein the functional substrate is a transparent substrate.

5. The light emitting diode according to claim 3, wherein a material of the functional substrate is GaP.

6. The light emitting diode according to claim 3, further comprising first and second electrodes provided on the light extraction surface side of the compound semiconductor layer, and a third electrode used for connection that is provided on a back surface of the functional substrate.

7. The light emitting diode according to claim 3, wherein the compound semiconductor layer and the functional substrate are bonded together with a reflective structure disposed therebetween.

8. The light emitting diode according to claim 3, wherein a material of the functional substrate is a metal.

9. The light emitting diode according to claim 3, wherein a material of the functional substrate is any one of GaP, Si and Ge.

10. The light emitting diode according to claim 3, further comprising a first electrode provided on the light extraction surface side of the compound semiconductor layer, and a second electrode provided between the compound semiconductor layer and a reflective structure.

11. The light emitting diode according to claim 1, wherein a thickness of the strained light emitting layer is within a range from 8 to 30 nm.

12. The light emitting diode according to claim 1, wherein the strain adjustment layer is a layer which is light-transmittable wherein the light is emitted from the light emitting unit.

13. The light emitting diode according to claim 1, wherein a composition formula of the barrier layer is $(Al_XGa_{1-X})_YIn_{1-Y}P$ (wherein $0.3 \leq X \leq 0.7$ and $0.48 \leq Y \leq 0.52$).

14. The light emitting diode according to claim 1, wherein the light emitting unit has a cladding layer on at least one of an upper surface and a lower surface of the strained light emitting layer, and a composition formula of the cladding layer is $(Al_XGa_{1-X})_YIn_{1-Y}P$ (wherein $0.5 \leq X \leq 1$ and $0.48 \leq Y \leq 0.52$).

15. The light emitting diode according to claim 1, wherein a composition formula of the strain adjustment layer is $(Al_XGa_{1-X})_YIn_{1-Y}P$ (wherein $0 \leq X \leq 1$ and $0.6 \leq Y \leq 1$).

16. A light emitting diode comprising a pn junction-type light emitting unit having a light emitting layer composed of n layers of a strained light emitting layer and n−1 layers of a barrier layer, wherein
when a barrier layer exists, the light emitting layer has a structure in which one strained light emitting layer and one barrier layer are laminated alternately,
n represents an integer of 1 to 7, and a thickness of the light emitting layer is not more than 250 nm,
a composition formula of the strained light emitting layer is $(Al_XGa_{1-X})_YIn_{1-Y}P$ (wherein $0 \leq X \leq 0.1$ and $0.37 \leq Y \leq 0.46$);
the light emitting diode further comprises a compound semiconductor layer comprising at least the light emitting unit and a strain adjustment layer laminated on the light emitting unit, and
wherein:
the strain adjustment layer has a lattice constant that is smaller than a lattice constant of the strained light emitting layer,
when a barrier layer exists, the lattice constant of the strain adjustment layer is smaller than a lattice constant of the barrier layer,
the strain adjustment layer has a thickness within a range of 0.5 to 20 μm, and
a composition formula of the strain adjustment layer is $Al_XGa_{1-X}As_{1-Y}P_Y$ (wherein $0 \leq X \leq 1$ and $0.6 \leq Y < 1$).

17. The light emitting diode according to claim 1, wherein a material of the strain adjustment layer is GaP.

18. The light emitting diode according to claim 3, wherein a side surface of the functional substrate has a vertical surface, which is positioned relatively closer to the compound semiconductor layer and is substantially perpendicular to the light extraction surface, and an inclined surface, which is positioned relatively distant from the compound semiconductor layer, is inclined inward relative to the light extraction surface, and is formed as an integrated structure with the vertical surface.

19. The light emitting diode according to claim 1, wherein an emission intensity of the strained light emitting layer at an emission wavelength of 700 nm is less than 10% of an emission intensity at a peak emission wavelength.

20. The light emitting diode according to claim 3, wherein the light extraction surface comprises a rough surface on which a surface roughening treatment has been performed.

21. The light emitting diode according to claim 1, wherein the light emitting diode is used for promoting photosynthesis during plant growth, and a peak emission wavelength within an emission spectrum of the light emitting unit is within a range from 655 to 675 nm.

22. The light emitting diode according to claim 21, wherein a full width at half maximum of the emission spectrum is within a range from 10 to 40 nm.

23. The light emitting diode according to claim 1, wherein a response time of the light emitting unit is 35 ns or less.

24. A light emitting diode lamp, comprising:
a mounting substrate having electrode terminals formed on a surface thereof, and
the light emitting diode according to claim 1, wherein
the light emitting diode is mounted on the mounting substrate, and
the light emitting diode is connected electrically to the electrode terminals.

25. The light emitting diode lamp according to claim 24, wherein
the compound semiconductor layer has a light extraction surface positioned on a side opposite to the functional substrate,
first and second electrodes are provided on the light extraction surface side of the compound semiconductor layer, and a third electrode used for connection is provided on a back surface of the functional substrate, and
the first or second electrode provided on the light emitting diode, and the third electrode provided on the functional substrate are connected substantially equipotentially.

* * * * *